(12) United States Patent
Kendall

(10) Patent No.: US 10,970,027 B2
(45) Date of Patent: *Apr. 6, 2021

(54) COMBINATION ORGANIC LIGHT EMITTING DIODE ("OLED") DEVICE

(71) Applicant: Bank of America Corporation, Charlotte, NC (US)

(72) Inventor: Russell Kendall, Seattle, WA (US)

(73) Assignee: Bank of America Corporation, Charlotte, NC (US)

( * ) Notice: Subject to any disclaimer, the term of this patent is extended or adjusted under 35 U.S.C. 154(b) by 23 days.

This patent is subject to a terminal disclaimer.

(21) Appl. No.: 16/039,505

(22) Filed: Jul. 19, 2018

(65) Prior Publication Data

US 2020/0026482 A1 Jan. 23, 2020

Related U.S. Application Data

(63) Continuation-in-part of application No. 15/957,040, filed on Apr. 19, 2018, now Pat. No. 10,331,990, (Continued)

(51) Int. Cl.
*G06F 3/14* (2006.01)
*H04N 13/239* (2018.01)
(Continued)

(52) U.S. Cl.
CPC ........ *G06F 3/1446* (2013.01); *H04N 13/239* (2018.05); *H04N 13/282* (2018.05); *H01L 27/3234* (2013.01); *H01L 27/3293* (2013.01)

(58) Field of Classification Search
CPC ... G06F 3/1446; H04N 13/239; H04N 13/282
(Continued)

(56) References Cited

U.S. PATENT DOCUMENTS 2,912,066 A 11/1959 Ellithorpe
3,703,864 A 11/1972 Bradford
(Continued)

FOREIGN PATENT DOCUMENTS

DE 102009028991 8/2009
EP 0827066 7/1997
WO WO 2013131153 4/2012

OTHER PUBLICATIONS

Conor Gaffey, "World's Smallest Nano Chip will Double Processing Power of Smartphones," Jun. 9, 2015.
(Continued)

*Primary Examiner* — On S Mung
(74) *Attorney, Agent, or Firm* — Weiss & Arons LLP; Michael A. Springs, Esq.

(57) ABSTRACT

A combination OLED display is provided. The combination OLED display may include a first device. The first device may include a first OLED display. The combination OLED display may include a second device. The second device may include a second OLED display. The first OLED display may communicate with the second OLED display. The first OLED display and the second OLED display may be within a predetermined proximity of one another. The first OLED display and the second OLED display may be configured to display a contiguous application and/or image.

13 Claims, 16 Drawing Sheets

Related U.S. Application Data which is a continuation of application No. 15/497,030, filed on Apr. 25, 2017, now Pat. No. 9,978,010, which is a continuation of application No. 15/187,931, filed on Jun. 21, 2016, now Pat. No. 9,665,818.

(51) Int. Cl.
*H04N 13/282* (2018.01)
*H01L 27/32* (2006.01)

(58) Field of Classification Search
USPC .................................................... 348/840
See application file for complete search history.

(56) References Cited

U.S. PATENT DOCUMENTS

| | | |
|---|---|---|
| 3,946,206 A | 3/1976 | Darjany |
| 4,372,225 A | 2/1983 | Tissot et al. |
| 4,557,352 A | 12/1985 | Tschappat, Jr. |
| 4,953,326 A | 9/1990 | Wexler et al. |
| 4,968,873 A | 11/1990 | Dethloff et al. |
| 5,168,354 A | 12/1992 | Martinez et al. |
| 5,313,051 A | 5/1994 | Brigida et al. |
| 5,539,819 A | 7/1996 | Sonoyama et al. |
| 5,693,956 A | 12/1997 | Shi et al. |
| 5,734,154 A | 3/1998 | Jachimowicz et al. |
| 5,770,849 A | 6/1998 | Novis et al. |
| 5,970,888 A | 10/1999 | Sheppard |
| 6,015,092 A | 1/2000 | Postlewaite et al. |
| 6,057,646 A | 5/2000 | Pieroth et al. |
| 6,173,899 B1 | 1/2001 | Rozin |
| 6,394,343 B1 | 5/2002 | Berg et al. |
| 6,724,103 B2 | 4/2004 | Parrault |
| 7,025,277 B2 | 4/2006 | Forrest et al. |
| 7,270,276 B2 | 9/2007 | Vayssiere |
| 7,357,315 B2 | 4/2008 | Vergara et al. |
| 7,360,682 B2 | 4/2008 | Shane et al. |
| 7,360,691 B2 | 4/2008 | Takayama |
| 7,461,774 B2 | 12/2008 | Vergara et al. |
| 7,523,856 B2 | 4/2009 | Block et al. |
| 7,588,183 B2 | 9/2009 | Shane et al. |
| 7,791,559 B2 | 9/2010 | Piasecki |
| 7,814,016 B2 | 10/2010 | Pranger |
| 7,856,116 B2 | 12/2010 | Rodriguez et al. |
| 7,940,159 B2 | 5/2011 | Clemens et al. |
| 7,992,789 B2 | 8/2011 | Borracci |
| 8,237,068 B2 | 8/2012 | Szaikowski |
| 8,276,823 B2 | 10/2012 | Chen |
| 8,282,007 B1 | 10/2012 | Cloutier et al. |
| 8,317,094 B2 | 11/2012 | Lehman |
| 8,378,932 B2 | 2/2013 | Fein et al. |
| 8,392,965 B2 | 3/2013 | Carter et al. |
| 8,413,893 B2 | 4/2013 | Kim |
| 8,471,782 B2 | 6/2013 | Muklashy et al. |
| 8,479,981 B2 | 7/2013 | Carmichael et al. |
| 8,399,889 B2 | 9/2013 | Wu et al. |
| 8,523,059 B1 | 9/2013 | Mullen et al. |
| 8,540,151 B1 | 9/2013 | Snyder et al. |
| 8,678,293 B2 | 3/2014 | Chen |
| 8,756,680 B2 | 6/2014 | Shashidhar |
| 8,810,816 B2 | 8/2014 | Fischer et al. |
| 8,820,638 B1 | 9/2014 | Cotter et al. |
| 9,250,657 B2 | 2/2016 | Kim et al. |
| 9,470,404 B2 | 10/2016 | Lee et al. |
| 9,491,879 B2 | 11/2016 | Cheng et al. |
| 9,538,127 B2 | 1/2017 | Gish |
| 9,577,216 B2 | 2/2017 | Fujino et al. |
| 10,056,048 B2 | 8/2018 | Kim |
| 2001/0007332 A1 | 7/2001 | Kjonaas et al. |
| 2003/0145205 A1 | 7/2003 | Sarcanin |
| 2003/0208405 A1 | 11/2003 | Putman et al. |
| 2005/0064936 A1 | 3/2005 | Pryor |
| 2005/0102499 A1 | 5/2005 | Kosuga et al. |
| 2005/0134461 A1 | 6/2005 | Gelbman et al. |
| 2005/0173518 A1 | 8/2005 | Takayama |
| 2005/0263590 A1 | 12/2005 | Branck et al. |
| 2006/0016884 A1 | 1/2006 | Block et al. |
| 2006/0091223 A1 | 5/2006 | Zellner et al. |
| 2006/0131393 A1 | 6/2006 | Cok et al. |
| 2006/0261174 A1 | 11/2006 | Zellner et al. |
| 2006/0289629 A1 | 12/2006 | Smith et al. |
| 2007/0115202 A1 | 5/2007 | Kiesenhofer |
| 2007/0273507 A1 | 11/2007 | Burchell et al. |
| 2007/0279315 A1 | 12/2007 | Laves et al. |
| 2008/0035736 A1 | 2/2008 | Tompkin et al. |
| 2008/0105751 A1 | 5/2008 | Landau |
| 2008/0158150 A1 | 7/2008 | Rossman et al. |
| 2009/0039154 A1 | 2/2009 | Williams et al. |
| 2009/0278452 A1 | 11/2009 | Kim |
| 2009/0298546 A1 | 12/2009 | Kim et al. |
| 2009/0314840 A1 | 12/2009 | Granucci et al. |
| 2010/0084476 A1 | 4/2010 | Zellner et al. |
| 2010/0260388 A1 | 10/2010 | Garrett et al. |
| 2010/0302206 A1 | 12/2010 | Yu et al. |
| 2011/0058113 A1 | 3/2011 | Threlkel et al. |
| 2011/0060640 A1 | 3/2011 | Thompson et al. |
| 2011/0140841 A1 | 6/2011 | Bona et al. |
| 2011/0148944 A1 | 6/2011 | Kobayashi |
| 2011/0164047 A1 | 7/2011 | Pance |
| 2011/0178928 A1 | 7/2011 | Carmichael et al. |
| 2011/0241996 A1 | 10/2011 | Vesely |
| 2012/0019434 A1 | 1/2012 | Kuhlman et al. |
| 2012/0268762 A1 | 10/2012 | Fischer et al. |
| 2012/0274727 A1 | 11/2012 | Robinson et al. |
| 2012/0280924 A1 | 11/2012 | Kummer et al. |
| 2013/0162594 A1 | 6/2013 | Paulsen et al. |
| 2013/0221112 A1 | 8/2013 | Lai et al. |
| 2013/0232082 A1 | 9/2013 | Krawczewicz et al. |
| 2013/0341394 A1 | 12/2013 | Seo et al. |
| 2014/0007002 A1 | 1/2014 | Chang et al. |
| 2014/0081729 A1 | 3/2014 | Ocher |
| 2014/0093144 A1 | 4/2014 | Feekes |
| 2014/0114861 A1 | 4/2014 | Mages et al. |
| 2014/0118415 A1 | 5/2014 | Seo |
| 2014/0172700 A1 | 6/2014 | Teuwen et al. |
| 2014/0226275 A1 | 8/2014 | Ko et al. |
| 2014/0267960 A1 | 9/2014 | Ward |
| 2014/0291406 A1 | 10/2014 | Ko |
| 2014/0337957 A1 | 11/2014 | Feekes |
| 2014/0339315 A1 | 11/2014 | Ko |
| 2014/0353384 A1 | 12/2014 | Hoegerl et al. |
| 2014/0374494 A1 | 12/2014 | Seo |
| 2015/0069126 A1 | 3/2015 | Leon |
| 2015/0077646 A1 | 3/2015 | Chen et al. |
| 2015/0116364 A1* | 4/2015 | Aurongzeb ........... G06F 1/1677 345/659 |
| 2015/0179025 A1 | 6/2015 | Cowell |
| 2015/0262052 A1 | 9/2015 | Pahuja |
| 2016/0004945 A1 | 1/2016 | Wade |
| 2016/0027391 A1 | 1/2016 | Gibson et al. |
| 2016/0054479 A1 | 2/2016 | Ho et al. |
| 2016/0085325 A1 | 3/2016 | Lee et al. |
| 2016/0098700 A1 | 4/2016 | Johnson et al. |
| 2016/0098709 A1 | 4/2016 | Johnson et al. |
| 2016/0171461 A1 | 6/2016 | Hoover et al. |
| 2016/0210453 A1 | 7/2016 | Seo et al. |
| 2016/0219046 A1 | 7/2016 | Ballard et al. |
| 2016/0224528 A1 | 8/2016 | Trevarthen et al. |
| 2016/0254336 A1 | 9/2016 | Zhang et al. |
| 2016/0307089 A1 | 10/2016 | Wurmfeld et al. |
| 2017/0103718 A1 | 4/2017 | Miller |
| 2017/0357979 A1 | 12/2017 | Khurana et al. |
| 2019/0278323 A1* | 9/2019 | Aurongzeb ......... G06F 3/04886 |

OTHER PUBLICATIONS http://www.us.schott.com/innovation/ultrathinglass/, Retrieved on Sep. 14, 2016.

"Schott's Reliable and Strong Ultra-Thin Glass Features in Fingerprint Sensors in new Smartphones," Retrieved on Sep. 14, 2016.

Ron Martens, "The OLED Handbook, A Guide to OLED Technology, Industry & Market," 2015 Edition.

Bryce Kellogg, Vamsi Talla, Shyamnath Gollakota and Joshua R.

(56) References Cited

OTHER PUBLICATIONS

Smith, "Passive Wi-Fi: Bringing Low Power to Wi-Fi Transmissions," Retrieved on May 11, 2016.
Ron Mertens, SecureCard—A New Secure Credit Card Technology, Utilizing an OLED Display, Nov. 21, 2006, Metalgrass Software.
John Wehr, "Card Size Specifications: When Does Card Size Matter?" Jan. 1, 2002.
Zachary Shahan, "Ultra-Thin-Solar-Cell Company Unstealths, Aims to Cut Cost of Solar Cells in Half!" Mar. 14, 2012, Sustainable Enterprises Media, Inc.
"ISO Magnetic Stripe Card Standards," Retrieved on Jul. 18, 2016.
"Coin Vs. Plastic: Which Credit Card Consolidation Tool is the Best?" Retrieved on Apr. 7, 2016, PayProTec.
"Tiny Batteries Could Revolutionize Green Energy," Retrieved on Apr. 5, 2016, National Geographic Society.
"Yubikey 4 & Yubikey 4 Nano," Retrieved on Apr. 7, 2016, Yubico.
"Magnetic Stripe Card Standards," Retrieved on Apr. 20, 2016, MagTek Inc., Seal Beach, California.
"A Power-Harvesting Pad-Less mm-sized 24/60GHz Passive Radio With On-Chip Antennas," Retrieved on Apr. 19, 2016, IEEE.
"Magnetic Stripe Card Recommendations," Retrieved on Apr. 20, 2016.
"Plastic Card Manufacturing Including Magnetic Stripe Tapelaying," Retrieved on Apr. 20, 2016.
Paul Buckley, "Flexible OLED Displays Target Volume Production in 2015," Feb. 5, 2015.
"MAX2837-2.3GHz to 2.7GHz Wireless Broadband RF Transceiver," Retrieved on May 30, 2016, Maxim Integrated.
"Ultrathin Rechargeable Lithium Polymer Batteries from PowerStream," Apr. 5, 2016, Lund Instrument Engineering, Inc.
Tom Abate, "Stanford Engineers Aim to Connect the World with Ant-Sized Radios," Sep. 9, 2014, Stanford University, Stanford California.
http://www.schott.com/advanced_optics/english/syn/advanced_optics/products/wafers-and-thin-glass/glass-wafer-and-substrates/ultra-thin-glass/index.html, Retrieved on May 30, 2016.
Jennifer Langston, "UW Engineers Achieve Wi-Fi at 10,000 Times Lower Power," Feb. 23, 2016.
Ron Mertens, "New All-In-One Credit Card Concept," Oct. 29, 2009, Metalgrass Software.
"Wi-Fi," Apr. 12, 2016, Wikimedia Foundation, Inc.
"Ant-Sized IoT Radio," Retrieved on Jul. 18, 2016.
Nick Pino, "Samsung's Latest OLED Can be a Mirror, a Window, or a TV," Jun. 11, 2015, Future US, Inc., San Francisco, California.
"Pneumatic Tube," Mar. 11, 2016, Wikimedia Foundation, Inc.
"New Virtual Tellers," Retrieved on Jun. 6, 2016, Frontier Bank.
Dario Borghino, "High-Tech Light Shutter Could Help Turn Your Windows into LCD Displays," May 1, 2015, Gizmag.
L. Zhao et al. "Novel Method for Fabricating Flexible Active Matrix Organic Light Emitting Diode (AMOLED) Displays," Sep. 21, 2011, Hewlett-Packard Development Company, L.P.
Amar Toor, "LG Unveils Flexible Plastic E-paper Display, Aims for European Launch Next Month," Mar. 29, 2012.

Martyn Williams, "Samsung, LG Show Flexible OLED, E-Paper Screens," Nov. 10, 2010.
"Electronic Paper," Jun. 10, 2016, Wikimedia Foundation, Inc.
"E Ink," Jun. 8, 2016, Wikimedia Foundation, Inc.
"Ink Technology: Electrophoretic Ink, Explained," Retrieved on Jun. 20, 2016, E Ink Holdings, Inc.
"Are Toeprints Unique, Like Fingerprints?" Retrieved on Jun. 23, 2016.
Sampath Srinivas, Dirk Balfanz, Eric Tiffany, Alexi Czeskis, "Univeral $2^{nd}$ Factor (U2F) Overview", May 14, 2016, FIDO Alliance.
"Sonavation Announces Fingerprint Imaging Through Smart Phone OLED Display," Feb. 22, 2016.
Dario Borghino, "Wearable Thermoelectric Generator Could Extend Your Smartwatch's Battery Life", Apr. 14, 2014, Gizmag.
"Inductive Charging", May 6, 2016, Wikimedia Foundation, Inc.
"Near Field Communication", Apr. 29, 2016, Wikimedia Foundation, Inc.
Sumi Das, "A Keyboard that Rises Up From Flat Touch Screens," Feb. 13, 2013.
Jessica Leber, "A Shape-Shifting Smartphone Touch Screen," Dec. 3, 2012.
Matthew Frankel, "Could This Be the Bank of the Future?" Nov. 9, 2014.
"Contactless Payment," Jul. 27, 2016, Wikimedia Foundation, Inc.
Zhiquin Chen, "Java Card Technology for Smart Cards: Architecture and Programmer's Guide," pp. 11-14, Copyright 2000, Sun Microsystems, Inc., Palo Alto, California.
Google Search: "Expandable and Retractable," Retrieved on Jul. 4, 2018.
"3D Visualization-Computer Definition," Your Dictionary, Retrieved on Jul. 2, 2018.
Google Search: "Capturing 3D Video Using Multiple Cameras," Retrieved on Jul. 2, 2018.
Ahmed et al., "Using Multiple RGB-D Cameras for 3D Video Acquisition and Spatio-Temporally Coherent 3D Animation Reconstruction," International Journal of Computer Theory and Engineering, vol. 6 No. 6, Dec. 2014.
Tom Simonite, "High-Resolution 3-D Scans Built from Drone Photos," https://www.technologyreview.com/s/535596/high-resolution-3-d-scans-built-from-drone-photos/, Mar. 19, 2015.
"Kinect," https://en.wikipedia.org/wiki/Kinect, Wikimedia Foundation, Inc., May 12, 2018.
Straw et al., Multi-Camera Real-Time Three-Dimensional Tracking of Multiple Flying Animals, https://www.ncbi.nlm.nih.gov/pmc/articles/PMC3030815, Jul. 14, 2010.
Google Search: "Multiple Cameras Used to Capture Three-Dimensional Space," Retrieved on Jul. 2, 2018.
Google Search: "REAL 3-Dimensional Capturing," Retrieved on Jul. 2, 2018.
"Stereoscopy," https://en.wikipedia.org/wiki/Stereoscopy, Wikimedia Foundation, Inc., Jun. 1, 2018.
"Three-Dimensional Space," https://en.wikpedia.org/wiki/Three-dimensional_space, Wikimedia Foundation, Inc., Jun. 26, 2018.
Tom Simonite, "Ultrasharp 3-D Maps," https://www.technologyreview.com/s/423838/ultrasharp-3-d-maps/ Apr. 26, 2011.

\* cited by examiner

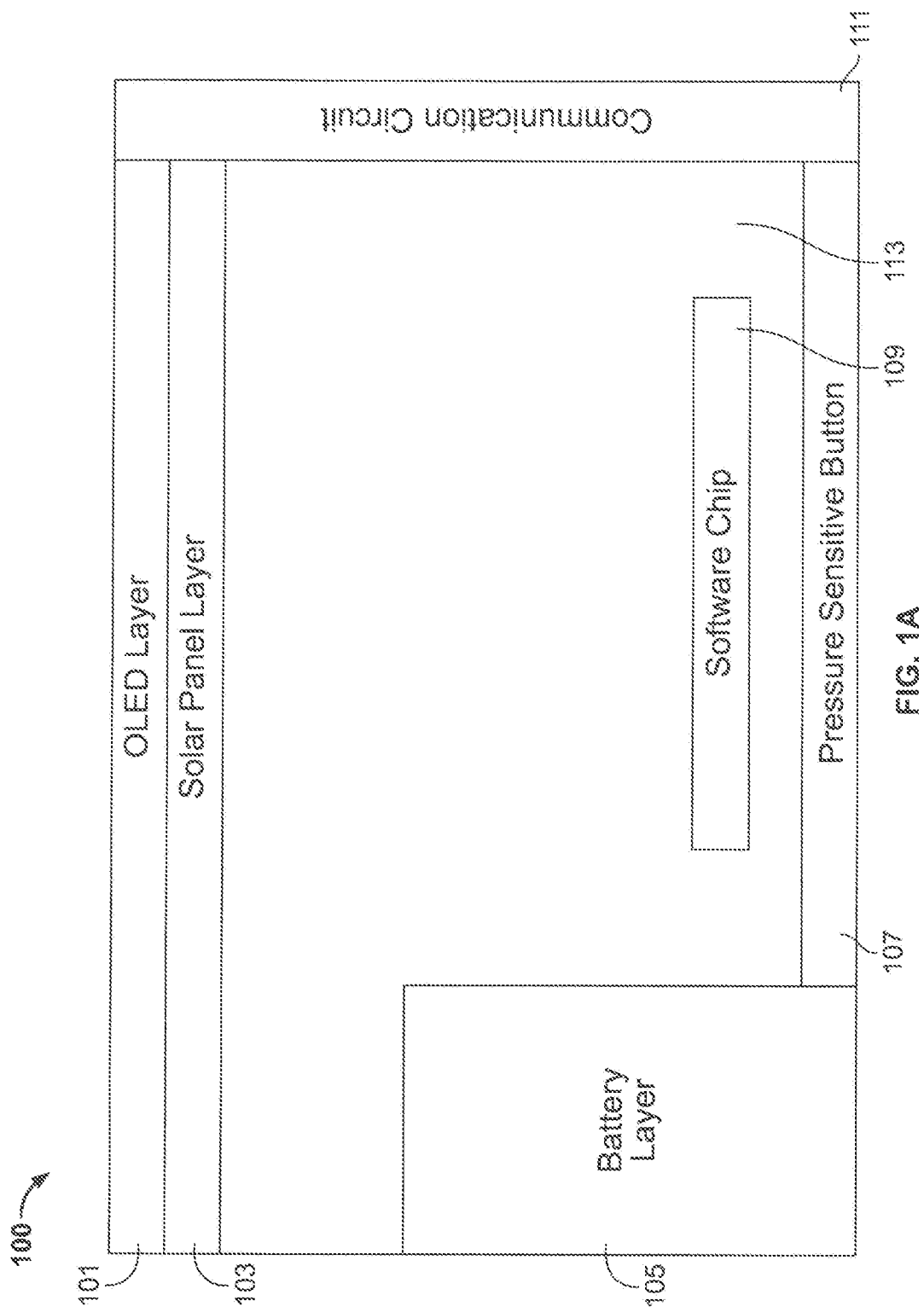

COMBINATION ORGANIC LIGHT EMITTING DIODE ("OLED") DEVICE

This application is a continuation-in-part of non-provisional U.S. patent application Ser. No. 15/957,040, filed on Apr. 19, 2018, entitled "ORGANIC LIGHT EMITTING DIODE ("OLED") UNIVERSAL PLASTIC", now U.S. Pat. No. 10,331,990, which is a continuation of non-provisional U.S. patent application Ser. No. 15/497,030, filed on Apr. 25, 2017, entitled "ORGANIC LIGHT EMITTING DIODE ("OLED") UNIVERSAL PLASTIC", now U.S. Pat. No. 9,978,010, which is a continuation of non-provisional U.S. patent application Ser. No. 15/187,931, filed on Jun. 21, 2016, entitled "ORGANIC LIGHT EMITTING DIODE ("OLED") UNIVERSAL PLASTIC", now U.S. Pat. No. 9,665,818, all of which are hereby incorporated by reference herein in their respective entireties.

FIELD OF TECHNOLOGY

This disclosure relates to OLED devices. More specifically, this disclosure relates to combinations of multiple OLED devices used together.

BACKGROUND OF THE DISCLOSURE

A need for a combination OLED device exists. A need also exists for a user to combine two or more devices to create a combination OLED device. For example, a user viewing a complicated financial transaction may wish to utilize a large screen to properly view the transaction. A large screen may be unavailable. Therefore, a user may wish to combine two or more relatively smaller OLED screens to create a large screen.

Therefore, a combination OLED device may be desirable. The combination OLED device may be comprised of two or more multiple distinct OLED devices.

SUMMARY OF THE DISCLOSURE

A combination OLED device may be provided. The combination OLED device may be enabled to capture three-dimensional data.

The combination OLED device includes a plurality of devices. Each of the plurality of devices may include one or more OLED displays. Each of the plurality of devices may include one or more cameras. The combination OLED device may include a connector. The connector may be configured to hold the plurality of devices in a specific configuration. The connector may be expandable and/or retractable. In some embodiments, the specific configuration may correspond to a position wherein at least two cameras on at least two of the devices correspond to a human viewing angle input from a right eye and a left eye.

Each of the one or more cameras may be configured to capture, photo-capture, video and/or photograph the same location with a distinct viewing angle. In some embodiments, each of the one or more cameras is configured to capture, photo-capture, video and/or photograph about the same location with a distinct viewing angle. The combination OLED device may be configured to capture three-dimensional videos and/or photographs using one or more cameras included in one or more of the plurality of devices.

In some embodiments, the combination OLED device may include one or more sets of mirrors. The one or more sets of mirrors may be associated with one or more of the cameras. The one or more mirrors may enable the one or more cameras to capture one or more stereoscopic and/or panoramic images. In other embodiments, a stereoscopic and/or panoramic image may be captured using at least one camera included in at least one of the plurality of devices.

BRIEF DESCRIPTION OF THE DRAWINGS

The objects and advantages of the disclosure will be apparent upon consideration of the following detailed description, taken in conjunction with the accompanying drawings, in which like reference characters refer to like parts throughout, and in which:

FIG. 1A shows illustrative apparatus in accordance with principles of the disclosure;

DETAILED DESCRIPTION OF THE DISCLOSURE

Figure 1B:
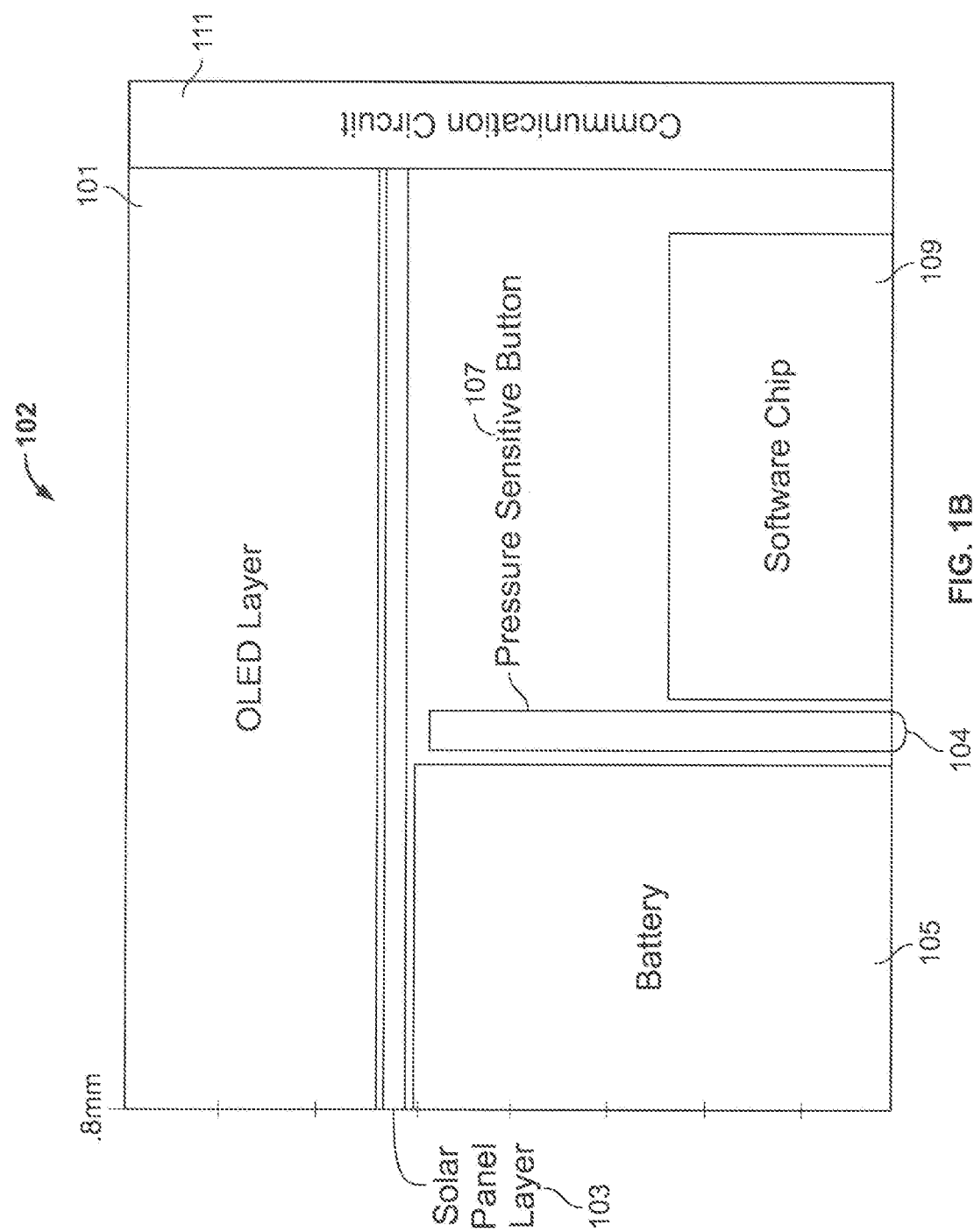
FIG. 1B shows another illustrative apparatus in accordance with principles of the disclosure.

A combination OLED display may be provided. The combination OLED display may include one or more devices. Each device may include one or more OLED displays. Such a device may be a smartphone, a tablet, a computer, a television, a personal computer, a laptop or any other suitable device.

One OLED device may be referred to as a first OLED device. Another OLED device may be referred to as a second OLED device.

The first OLED device may communicate with the second OLED device. The first OLED device and/or display may be physically connected to the second OLED device and/or display via a magnetic connection. A magnetic strip on the first OLED device and/or display and a magnetic strip on the second OLED device and/or display may facilitate the magnetic connection. The magnetic connection may enable the first OLED device and the second OLED device to be connected in a specific fashion. In some embodiments, the magnetic connection may facilitate communication between the first OLED device and the second OLED device.

In some embodiments, the first OLED device may communicate with the second OLED device via a wired connection. In some embodiments, the first OLED device may communicate with the second OLED device via a Universal Serial Bus ("USB") connection. In some embodiments, the first OLED device may communicate with the second OLED device via a synchronization. In some embodiments, the first OLED device may communicate with the second OLED device via a Bluetooth connection. In some embodiments, the first OLED display and the second OLED display may be within a predetermined proximity of one another. The predetermined proximity may be 0-2 inches. The predetermined proximity may be 0-12 inches. In some embodiments, the first OLED display and the second OLED display may be touching. In other embodiments, the first OLED display and the second OLED display may not be touching.

The communication between the first OLED device and the second OLED device may enable the first OLED display and the second OLED display to display a contiguous application. Such a contiguous application may be a financial transaction, a video, an internet-based purchase or any other suitable application. When the combination OLED display (the first OLED display plus the second OLED display) displays a contiguous application, one device may become the controlling device. The controlling device may instruct the other one or more devices what to display. In some embodiments, the device that initiates the communication with the other devices may be identified and/or act as the controlling device.

In some embodiments, the combination OLED display may display an application displayed on an original display in a larger size or other suitable change in proportion than an initial display of the application.

Apparatus and methods described herein are illustrative. Apparatus and methods in accordance with this disclosure will now be described in connection with the figures, which form a part hereof. The figures show illustrative features of apparatus and method steps in accordance with the principles of this disclosure. It is understood that other embodiments may be utilized, and that structural, functional, and procedural modifications may be made without departing from the scope and spirit of the present disclosure.

FIG. 1A shows an illustrative side view of OLED device 100. OLED device 100 includes OLED layer 101. OLED layer 101 may form a reshape-able, bendable, and/or rollable, thin OLED display with relatively lower power consumption than other display technology.

OLED device 100 may include a touch sensor (not shown). A touch sensor may be alternatively referred to herein as a tactile sensor. The touch sensor may be not greater than 0.001 mm thick. In some embodiments, the touch sensor may be embedded within OLED layer 101. Integrating the touch sensor into the OLED layer 101 may reduce reflectivity due to any space between the touch sensor and OLED layer 101. Reducing reflectivity may increase visibility of information presented using OLED layer 101.

Using OLED layer 101 to display information may have several technical advantages. OLED displays may provide lower power consumption, wider viewing angles, better colors, higher contrast, operate in a wider temperature ranges and enable faster refresh rates than other display technology. In some embodiments, OLED displays may be fabricated directly on control circuitry. OLED displays may only include trace amounts of heavy metals. Thus, when disposed of, OLED displays may be less harmful to the environment than other display technology.

OLED device 100 includes solar panel layer 103. OLED displays may be transparent when not illuminated. Thus, when OLED layer 101 is not illuminated, OLED layer 101 may be transparent. Sunlight may pass through OLED layer 101 and reach solar panel layer 103. Solar panel layer 103 may convert solar energy into electricity that powers one or more components of OLED device 100. Solar panel layer 103 may be thin enough to be flexible.

OLED device 100 includes battery 105. Battery 105 may be rechargeable. Battery 105 may be flexible. Battery 105 may be recharged by power generated by solar panel layer 103. Battery 105 may be rechargeable from a power source external to OLED device 100.

OLED device 100 includes software chip 109. Software chip 109 may control overall operation of OLED device 100 and its associated components. Software chip 109 may include the processor circuit. Software chip 109 may include a non-transitory memory. OLED device 100 may include non-transitory memory locations (not shown) within thickness 113. Software chip 109 may access such memory locations. The non-transitory memory locations may store instructions, that when executed by software chip 109, cause OLED device 100 to perform various functions.

For example, memory locations may store software used by OLED device 100, such as an operating system, application programs and an associated database.

OLED device 100 includes communication chip 111. Communication chip 111 may be a communication circuit. Communication chip 111 may provide OLED device 100 with wireless communication functionality. Communication chip 111 may enable OLED device 100 to communicate using a variety of communication protocols including, Wi-Fi, Bluetooth, Ethernet, NFC and cellular telecommunications.

OLED device 100 also includes pressure sensitive button 107. Pressure sensitive button 107 may be mechanically actuated. Actuation of pressure sensitive button 107 may provide an electronic signal to software chip 109 or any other component of OLED device 100.

For example, mechanical actuation of pressure sensitive button 107 may power-on and/or power-off software chip 109. Mechanical actuation of pressure sensitive button 107 may inform software chip 109 of a user's selection of choices displayed using OLED layer 101.

FIG. 1A shows illustrative components 101-113 of OLED device 100 in an arrangement within a thickness of OLED device 100. The arrangement shown in FIG. 1A is illustrative. OLED device 100 may include additional components not shown in FIG. 1A, such as a biometric sensor. One or more of components 101-113, and any additional components, may be arranged within OLED device 100 in any suitable fashion. For example, pressure sensitive button may be located in space 113. OLED layer 101 and/or solar panel layer 103 may flex or bend to allow a user to mechanically actuate pressure sensitive button 107.

Some embodiments may not include all of components 101-113. For example, an OLED device may not include solar panel layer 103 or pressure sensitive button 107.

FIG. 1B shows illustrative view 102 of an OLED device. View 102 shows illustrative thicknesses of components 101-111. View 102 shows that in some embodiments, pressure sensitive button 107 may include a portion 104 that protrudes from a surface of an OLED device. In some embodiments, pressure sensitive button 107 may include a portion 104 that dips below a surface of the OLED device.

Figure 2:
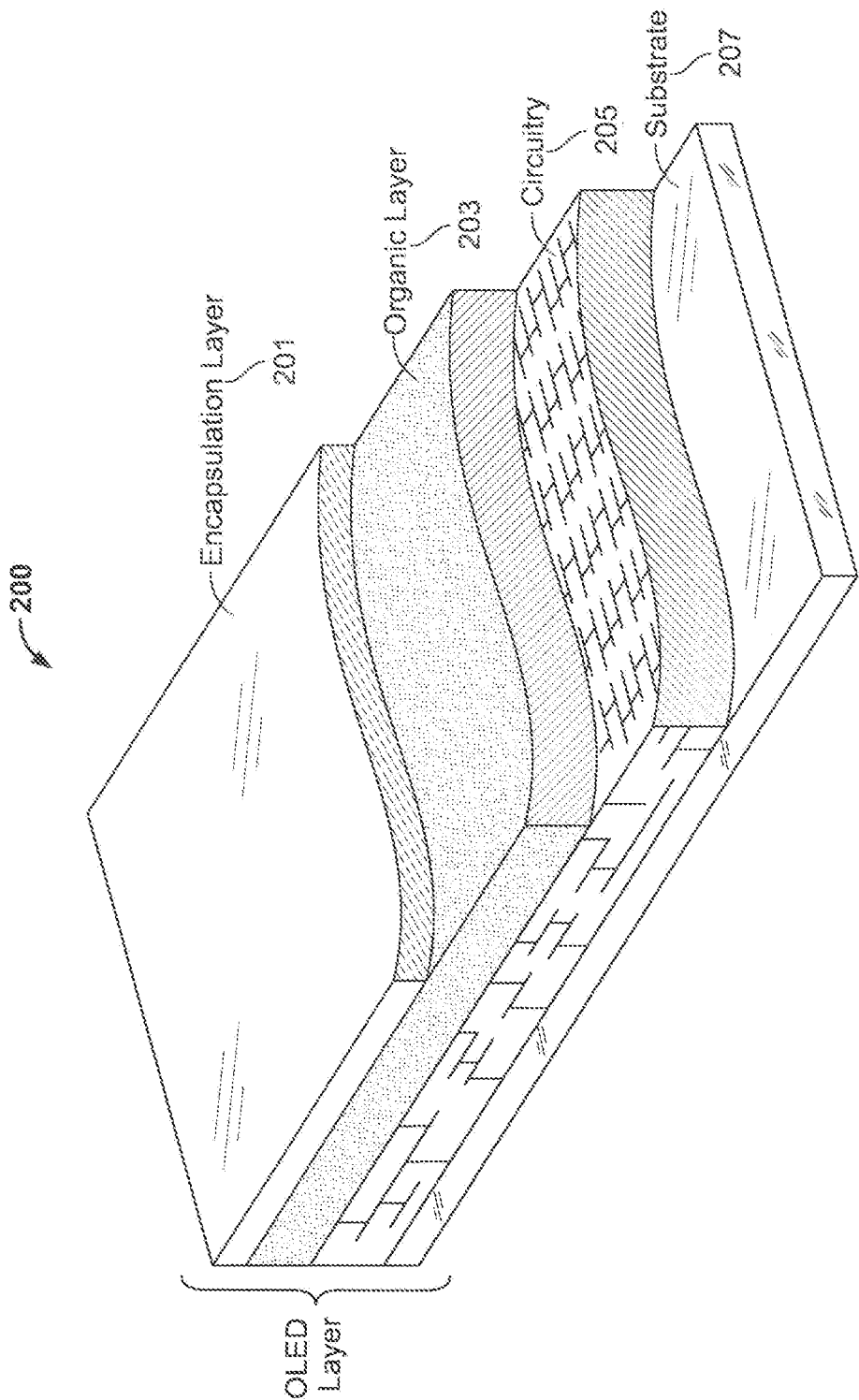
FIG. 2 shows yet another illustrative apparatus in accordance with principles of the disclosure.

FIG. 2 shows structures 200 of an illustrative OLED layer, such as OLED layer 101 (shown in FIG. 1). Structures 200 include four layers: encapsulation layer 201, organic layer 203, circuitry layer 205 and substrate layer 207.

Encapsulation layer 201 protects the OLED layer from exposure to oxygen, water and other contaminants. Preferably, encapsulation layer 201 is flexible and transparent. Glass and plastic are exemplary materials that may be used to construct encapsulation layer 201. When glass is used to construct encapsulation layer 201, the glass may be very thin and flexible. For example, the glass may be between 50 micrometers ("μm") and 100 μm thick.

In some embodiments, encapsulation layer 201 may be constructed using thin-film encapsulation techniques such as Atomic Layer Deposition ("ALD"). ALD is a process that utilizes chemicals that, when deposited on a material, react to create a solid, thin film.

Structures 200 include organic layer 203.

Organic layer 203 typically includes an emissive solid-state semiconductor. Organic layer 203 may be constructed from a thin film of organic (carbon-based) material. For example, organic layer 203 may include one or more OLEDs. When electricity is applied to an OLED within organic layer 203, electrons flow through organic layer 203 and release photons, thereby emitting light. Different types of emissive materials may be used. Each type of material may be associated with a different color light. An intensity of light emitted by organic layer 203 may be controlled by the amount of electricity flowing through organic layer 203.

Organic layer 203 may be doped with "host" materials. Host material may affect a property, such as power efficiency, of organic layer 203. For example, organic layer 203 may be doped with materials that improve its operation and/or achieve a desired color.

Organic layer 203 may include two or more sub-layers (not shown). For example, organic layer 203 may include 5, 10 or 15 sublayers. Illustrative sub-layers may include: (1) an electron transport layer, (2) a blocking layer, (3) an emissive layer, (4) a hole transport layer and (5) an injection layer.

For example, an emissive layer may be placed between a cathode and an anode. When electricity is applied, electrons flow from the cathode to the anode. OLED displays may be driven by electrical current or voltage. In a preferred embodiment, the OLED display is driven by current. The cathode inserts electrons into the emissive layer, and the anode removes the electrons. Electron "flow" through the emissive layer releases photons, generating light. The color of the generated light may be changed by including different types of materials within the emissive layer.

A direction of light emitted by organic layer 203 may be controlled by a degree of transparency of the anode and/or cathode. In some embodiments, a cathode may be reflective. Such a cathode may preferably be constructing using an aluminum based-compound or lithium fluoride. An anode may be transparent. A transparent anode may preferably be constructed using indium tin oxide. In such embodiments, when current flows between the cathode and anode, light is emitted through circuitry layer 205 and substrate layer 207. Circuitry layer 205 and substrate layer 207 may be transparent. Such embodiments may be referred to as "bottom-emitting OLEDs."

In some embodiments, the cathode may be transparent. Such a cathode may preferably be constructed using indium tin oxide. The anode may be reflective. The reflective anode may direct light toward the transparent cathode. Such embodiments may be referred to as "top-emitting OLEDs." Typically, top-emitting designs are more efficient and are used to construct higher resolution OLED displays.

Additionally, top-emitting designs may allow organic layer 203 to be formed on a non-transparent substrate. Small-and medium-sized OLED displays (e.g., 1-7 inches) are typically constructed using top-emitting techniques.

Organic layer 203 may include one or more pixels. Different architectures are available for forming pixels using OLEDs. One exemplary architecture includes positioning different color (e.g., red, green and blue) OLEDs adjacent to each other. Another exemplary architecture includes stacking different color OLEDs on top of each other. OLEDs may be stacked because materials used to construct organic layer 203 may be transparent. A stacked design may provide a smaller pixel size and higher resolution.

Structures 200 include circuitry layer 205. Circuitry layer 205 includes electronics that drive one or more pixels formed within organic layer 203. Preferably, amorphous silicon ("a-Si") and low temperature polysilicon ("LTPS") may be used to construct circuitry layer 205. In some embodiments, circuitry layer 205 may be transparent.

Substrate layer 207 supports circuitry layer 205, organic layer 203 and encapsulation layer 201. Substrate layer 201 may be constructed using various materials. For example, substrate layer 207 may be constructed using glass, plastic or metal materials. In some embodiments, such as in bottom-emitting OLEDs, substrate layer 207 may function as encapsulation layer 201.

Figure 3:
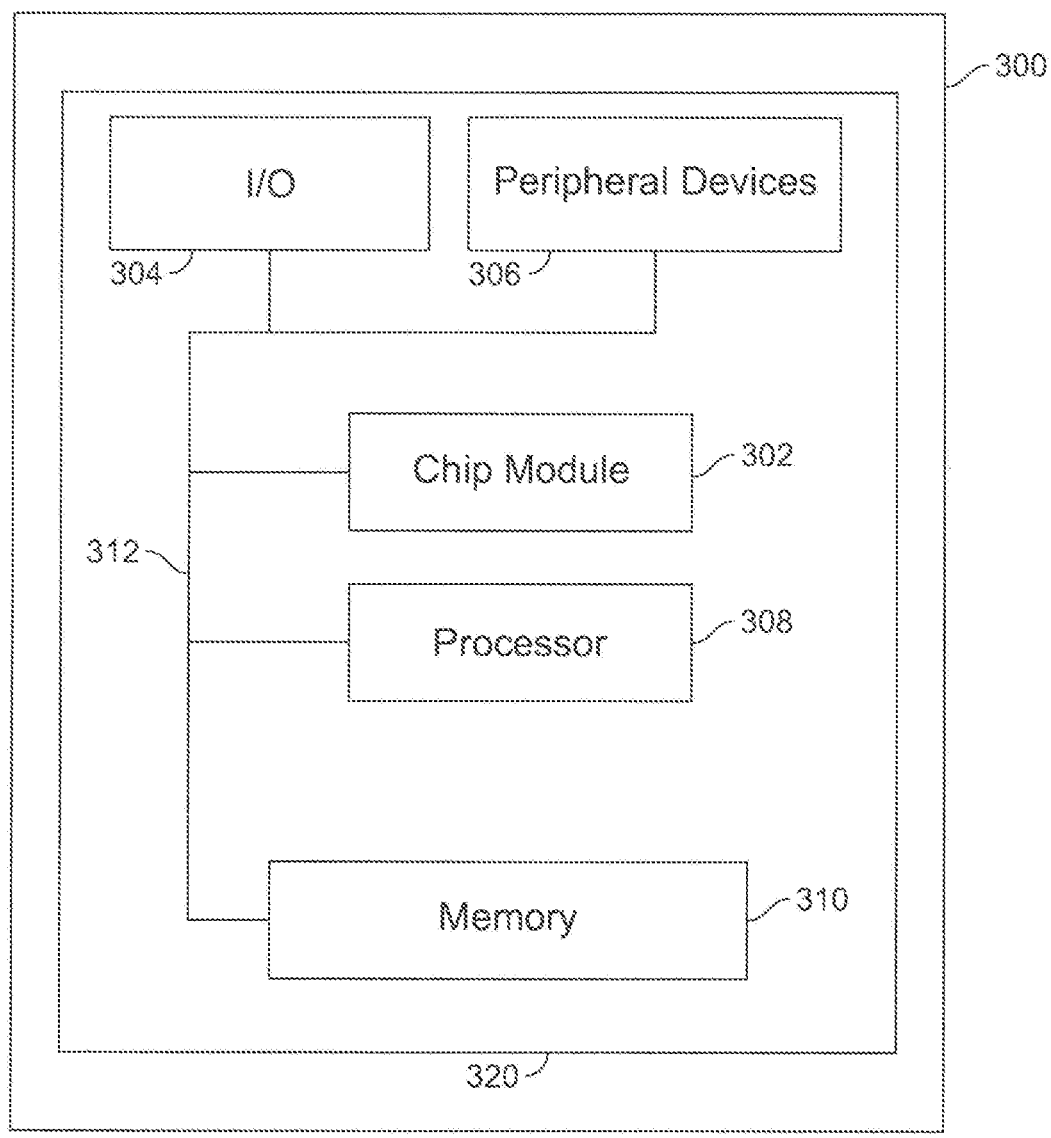
FIG. 3 shows still another illustrative apparatus in accordance with principles of the disclosure.

FIG. 3 shows illustrative software chip 300. Software chip 300 may include chip module 302, which may include one or more integrated circuits, and which may include logic configured to perform any suitable logical operation.

Software chip 300 may include one or more of the following components: I/O circuitry 304, which may include a transmitter device and a receiver device and may interface with fiber optic cable, coaxial cable, telephone lines, wireless devices, PHY layer hardware, a keypad/display control device or any other suitable encoded media or devices; peripheral devices 306, which may include counter timers, real-time timers, power-on reset generators or any other suitable peripheral devices; logical processing device 308, which may compute data structural information, structural parameters of the data, quantify indices; and machine-readable memory 310.

Machine-readable memory 310 may be configured to store, in machine-readable data structures: sensitive data, value, currency, currency exchange rates, location information, transaction histories, electronic signatures of biometric features or any other suitable information or data structures.

Components 302, 304, 306, 308 and 310 may be coupled together by a system bus or other interconnections 312 and may be present on one or more OLED devices such as OLED device 320. In some embodiments, the components may be integrated into a single chip. The chip may be silicon-based.

FIGS. 4-9 show illustrative layers that may be present within an illustrative OLED device.

Figure 4:
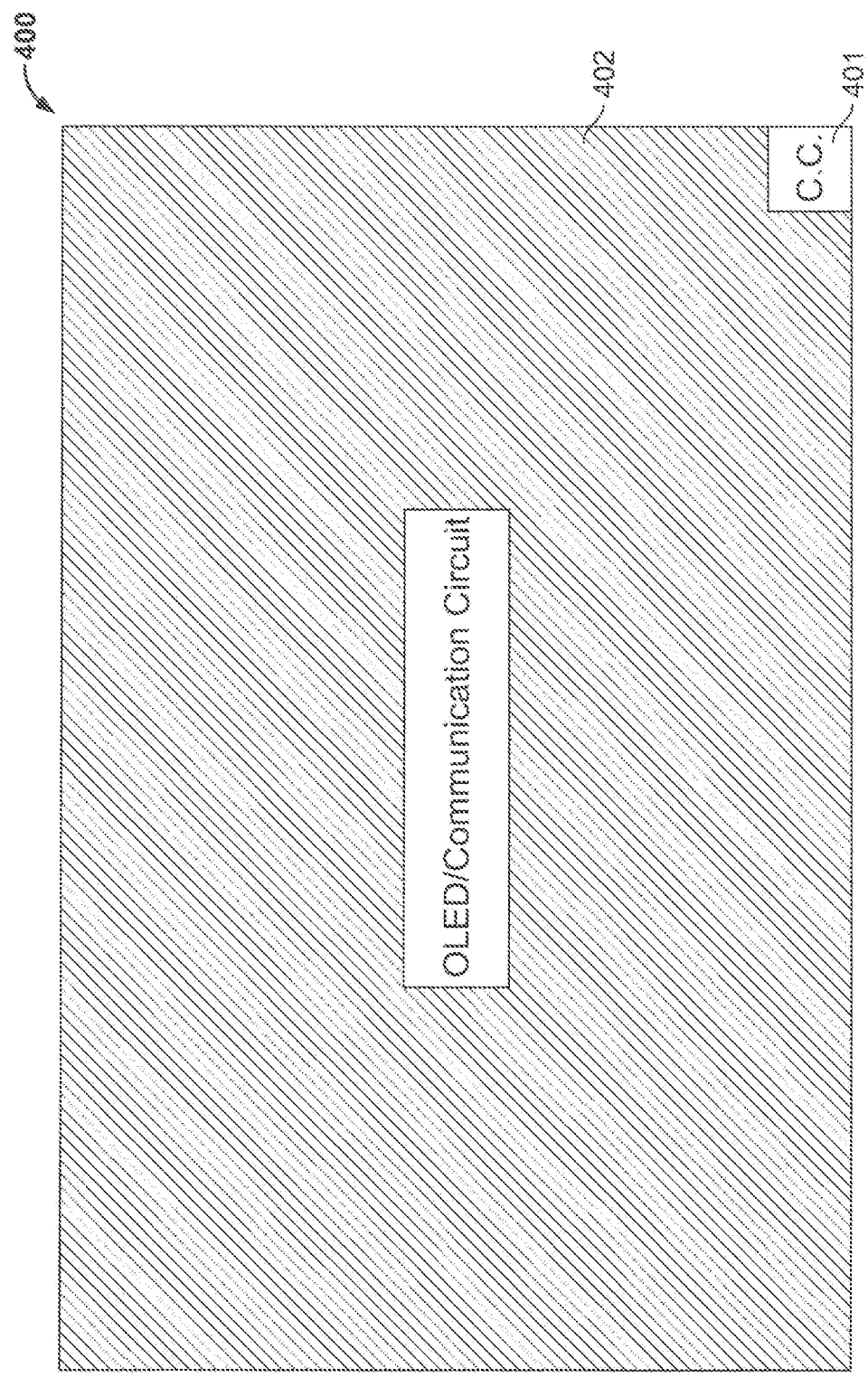
FIG. 4 shows another illustrative apparatus in accordance with principles of the disclosure.

FIG. 4 shows illustrative layer 402. Layer 402 includes OLED layer (such as OLED layer 200, shown in FIG. 2). FIG. 4 also shows that, in some embodiments, communication circuit 401 may penetrate layer 402.

Figure 5:
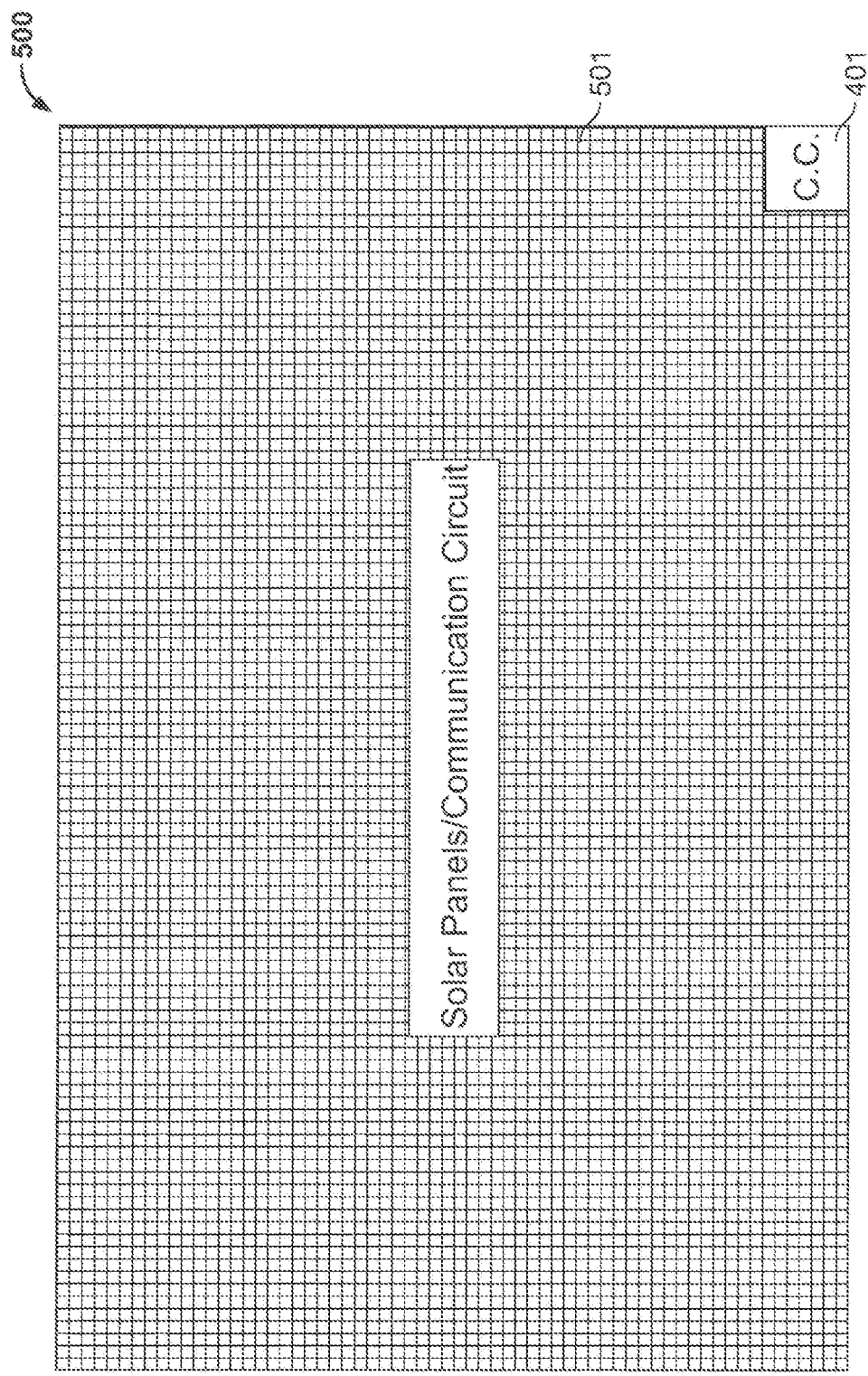
FIG. 5 shows yet another illustrative apparatus in accordance with principles of the disclosure.

FIG. 5 shows illustrative layer 500. Layer 500 includes solar panels 501 that may be used to power various components of an OLED device (e.g., circuitry layer 205, shown in FIG. 2). FIG. 5 also shows that, in some embodiments, communication circuit 401 may penetrate layer 500.

Figure 6:
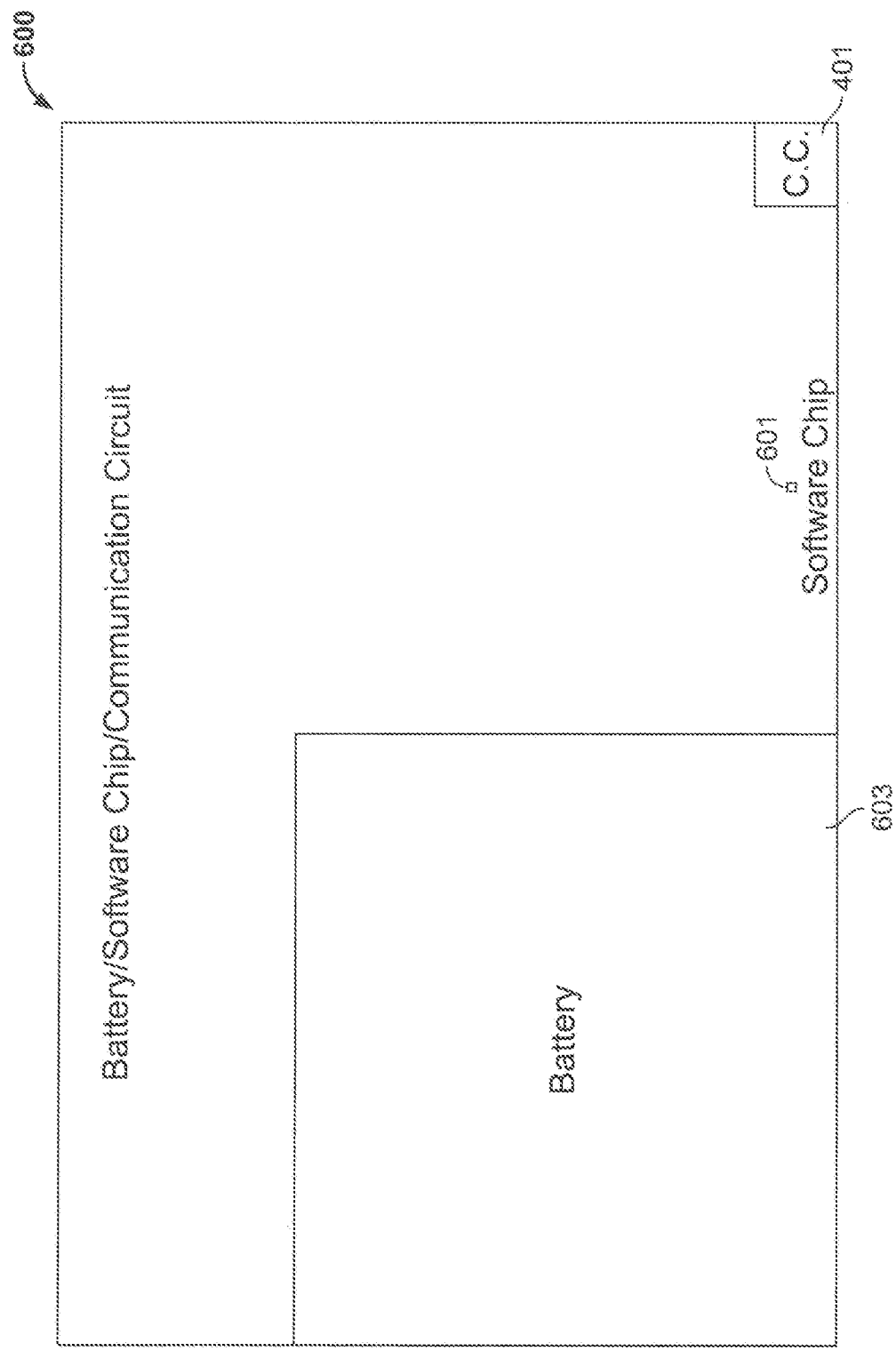
FIG. 6 shows still another illustrative apparatus in accordance with principles of the disclosure.

FIG. 6 shows illustrative layer 600. Layer 600 includes software chip 601. Software chip 601 may include one or more features of software chip 109 (shown in FIG. 1). Layer 600 includes battery 603. Battery 603 may include one or more features of battery layer 105 (shown in FIG. 1A). FIG. 6 shows that, in some embodiments, communication circuit 401 may penetrate layer 600.

Figure 7:
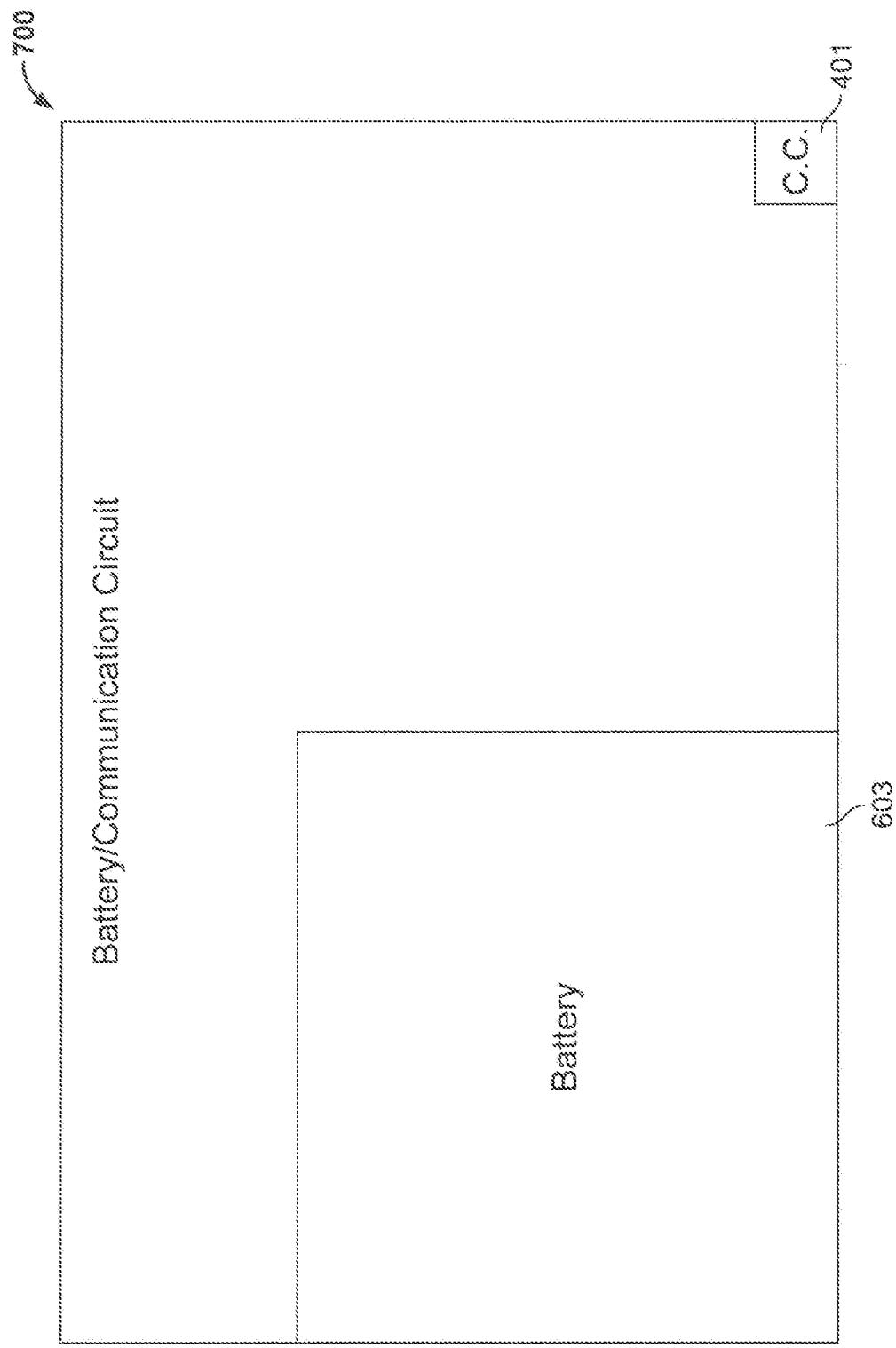
FIG. 7 shows another illustrative apparatus in accordance with principles of the disclosure.

FIG. 7 shows illustrative layer 700. FIG. 7 shows that, in some embodiments, battery 603 may penetrate layer 700. FIG. 7 shows that, in some embodiments, communication circuit 401 may penetrate layer 700.

Figure 8:
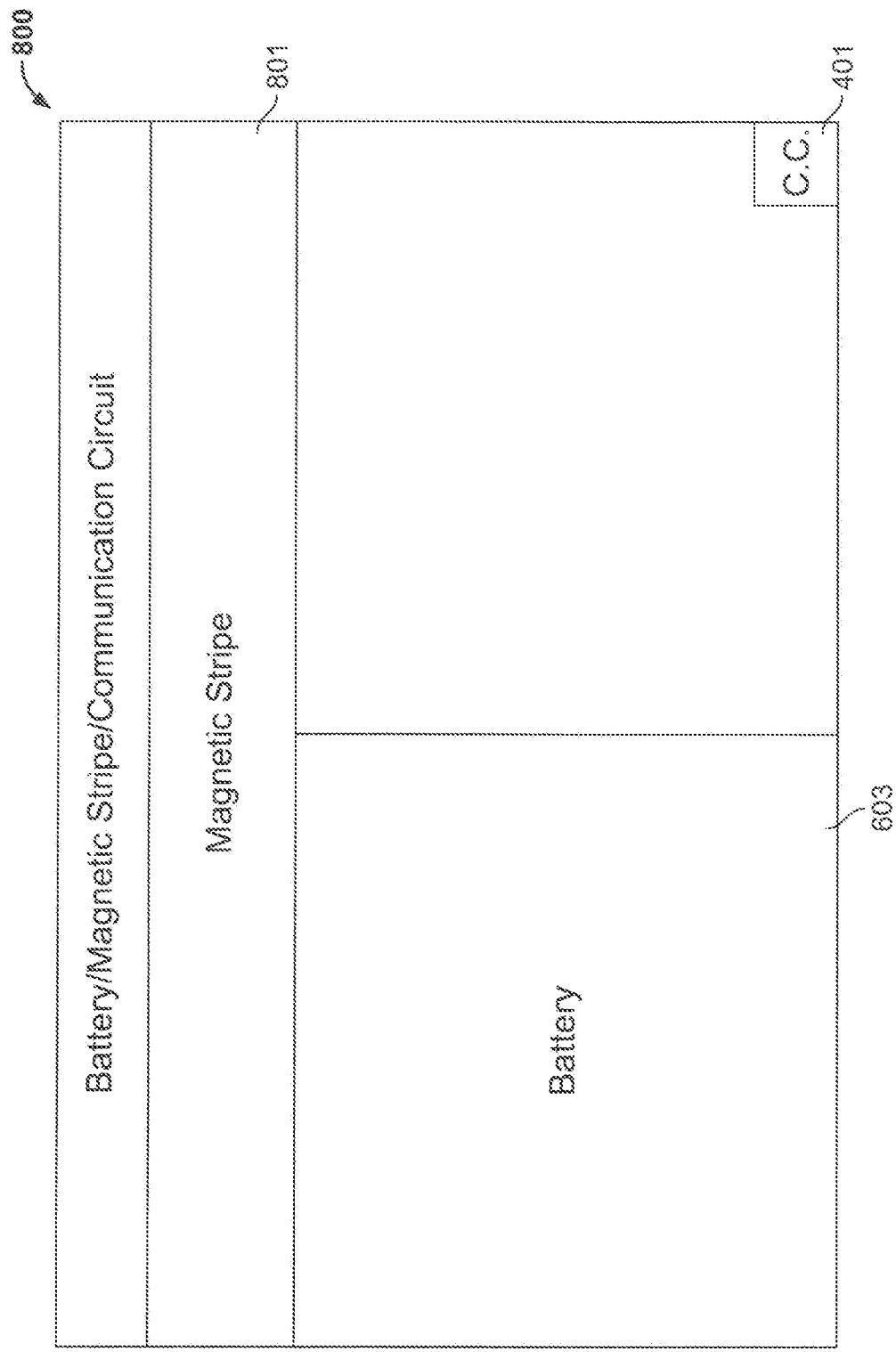
FIG. 8 shows yet another illustrative apparatus in accordance with principles of the disclosure.

FIG. 8 shows illustrative layer 800. FIG. 8 shows that, in some embodiments, battery 603 may penetrate layer 800. FIG. 8 shows that, in some embodiments, communication circuit 401 may penetrate layer 800. FIG. 8 shows that layer 800 may include magnetic stripe 801. Magnetic stripe 801 may include magnetically encoded information. Magnetic stripe 801 may provide backwards compatibility for OLED devices described herein.

Figure 9:
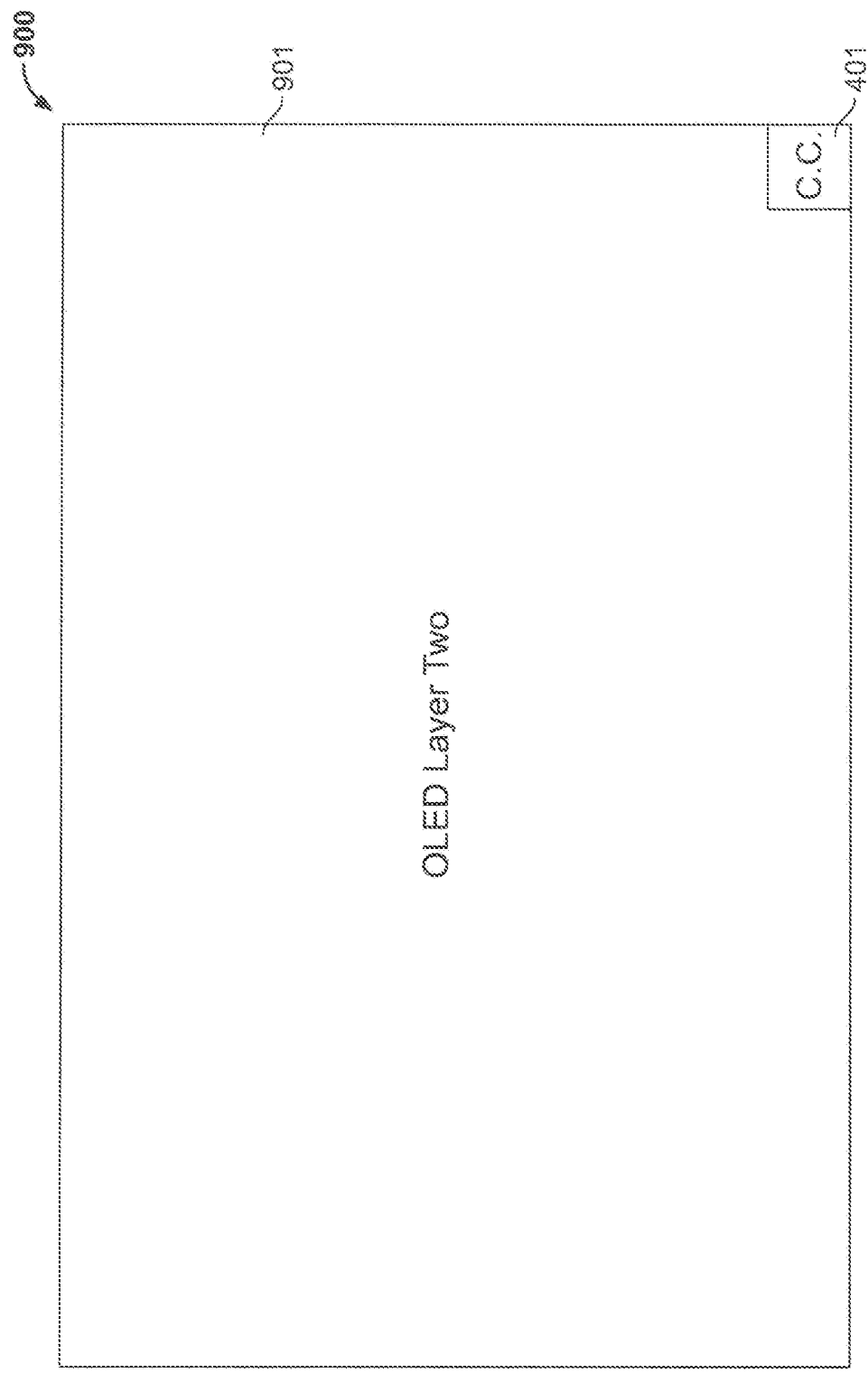
FIG. 9 shows still another illustrative apparatus in accordance with principles of the disclosure.

FIG. 9 shows illustrative layer 900. Layer 900 includes a second OLED layer 901. Second OLED layer 901 may include one or more features of OLED layer 200 (shown in FIG. 2). Second OLED layer 901 may allow front and back faces of an OLED device to include an OLED display. FIG. 9 also shows that communication circuit 401 may penetrate layer 900.

Figure 10A:
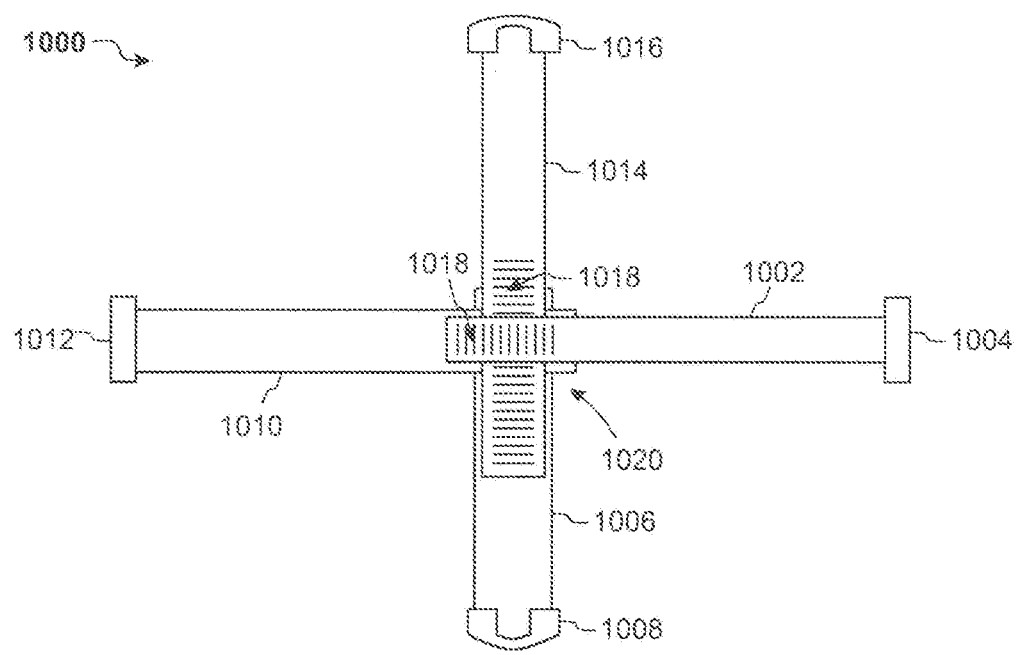
FIG. 10A shows yet another illustrative apparatus in accordance with principles of the disclosure.

FIG. 10A shows retractable and/or expandable device 1000 for holding one or more OLED devices. Device 1000 may include two or more sets of expandable/retractable bars. A first set of expandable/retractable bars may be shown at 1002 and 1010. Clips may be included at the end of each retractable bar in order to hold the device in place. Clip 1004 may be included at the end of bar 1002. Clip 1012 may be included at the end of bar 1010.

A second set of expandable/retractable bars may be shown at 1006 and 1014. Clip 1016 may be included at the end of bar 1014. Clip 1008 may be included at the end of bar 1006.

It should be appreciated that one bar, of a set, may fit into a second bar of a set. For example, bar 1002 may fit into bar 1010. Bar 1002 may be held in place with respect to a specific position on bar 1010 by a set of ridges, as shown at 1018. Bar 1014 may be held in place with respect to a specific position on bar 1006 by a set of ridges, as shown at 1018.

A connection between bars 1002 and 1010 and bars 1014 and 1006 themselves may be hinged, as indicated by lead line 1020. The hinging may allow for bars 1004 and 1010 to be positioned at an angle to each other. The hinging may also allow for bars 1014 and 1006 to be positioned at angle to each other. Therefore, OLED devices held by device 1000 may be positioned at an angle to each other. (See FIG. 10B for hinged device)

In some embodiments, device 1000 may be created from magnetic metal. In these embodiments, the OLED device, or an attachment to the OLED device, may magnetically attach to device 1000.

In some embodiments, device 1000 may include wires and universal serial ports ("USB") (not shown). In these embodiments, device 1000 may be used to connect one OLED device to another OLED device using the wires and USB ports.

Figure 10B:
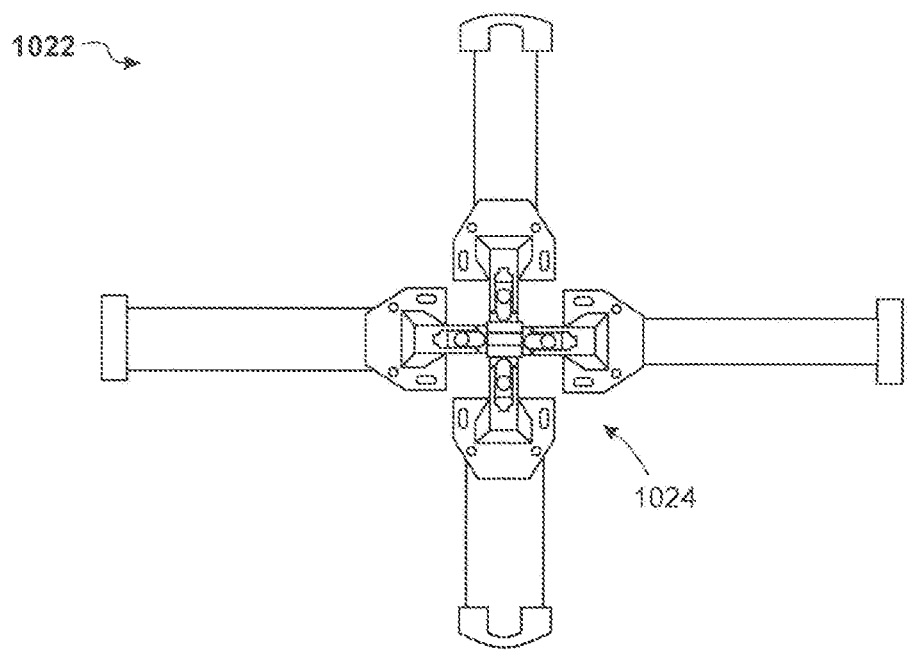
FIG. 10B shows still another illustrative apparatus in accordance with principles of the disclosure.

FIG. 10B shows device 1022. FIG. 10B may show a non-OLED-display side of device 1022. Hinges 1024, as are known to of skill in the art, may enable extendable/retractable arms, included in device 1022, to be set at an angle to one another. The arms may hold one or more OLED devices at a variety of angles to one another.

Figure 11A:
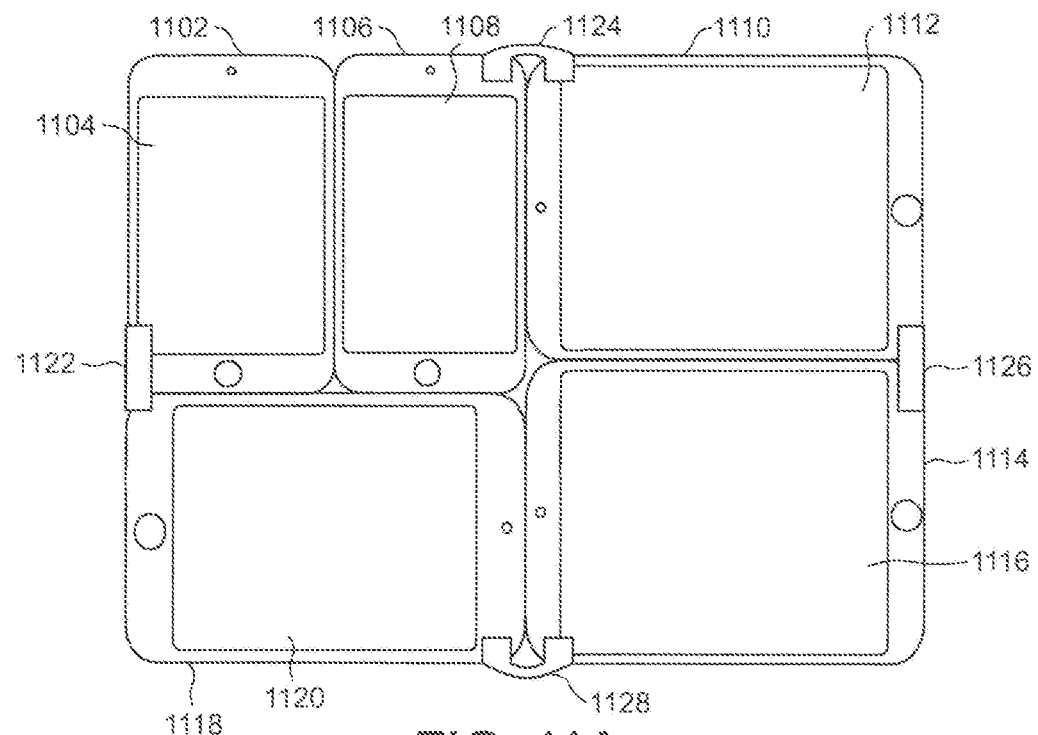
FIG. 11A shows yet another illustrative apparatus in accordance with principles of the disclosure.

FIG. 11A shows a device, such as device 1000 shown in FIG. 10A, holding a plurality of OLED devices. Clips 1122, 1124, 1126 and 1128 may hold together devices 1102, 1106, 1110, 1114 and 1118. Device 1102 may include OLED display 1104. Device 1106 may include OLED display 1108. Device 1110 may include OLED display 1112. Device 1114 may include OLED display 1116. Device 1118 may include OLED display 1120. Devices 1102, 1106, 1110, 1114 and 1118 may all include a connection application for connecting electronically to one another or for a single device to connect with each of the individual devices.

A connection application included on a first OLED device may communicate with other connection applications, included on a second OLED device. The connection may be instantiated based on fulfillment, by the first OLED device and the second OLED device, of one or more of criteria included in a predetermined set of criteria. The criteria may include a first OLED device being located within a specific proximity of a second OLED device. The criteria may include physical touching of a first OLED device to a second OLED device. The criteria may include a magnetic connection between a magnetic strip included on a first OLED device and a magnetic strip included on a second OLED device. The criteria may include any other suitable criteria.

The connection application may communicatively connect two devices over a wired connection, over a wireless connection or over any other suitable connection. The wireless connection may be a Bluetooth connection, near field communication ("NFC") connection (NFC communication may utilize radio frequency to transmit data), Beacon connection, Infrared ("IR") technology such as IR wireless technology (IR wireless may transfer data through IR radiation. IR may be electromagnetic energy at a wavelength longer than the wavelength of red light) or any other suitable connection. It should be appreciated that, in some embodiments, one device may act as the primary device, and may connect with all of the devices. In this embodiment, the primary device may include multiple one-to-one connections. In this embodiment, the primary device may retrieve information from each device regarding its geographic location and situation and the respective size of each of the devices relative to the remaining devices within the entire display. Therefore, the primary device may be able to instruct each of the other devices how and what to display.

In other embodiments, each device may connect to another device in a chained fashion. In this embodiment, each device may be given all information relating to the entire display. Each device itself may determine its position in the combination of devices and display the appropriate portion of the entire display in the appropriate fashion.

The connection application may combine the OLED displays to enable the display of a contiguous application.

The connection between the OLED devices may be terminated at any point. In some embodiments, a user may press a button on a device in order to terminate the device's connection with the other OLED devices. In other embodiments, removing a first OLED device from within a predetermined proximity with the other connected OLED devices may terminate the connection with the other OLED devices. In other embodiments, the OLED devices may terminate connection after a predetermined time period, such as 5 minutes, 10 minutes, 30 minutes, 60 minutes, 24 hours or any other suitable time period.

Figure 11B:
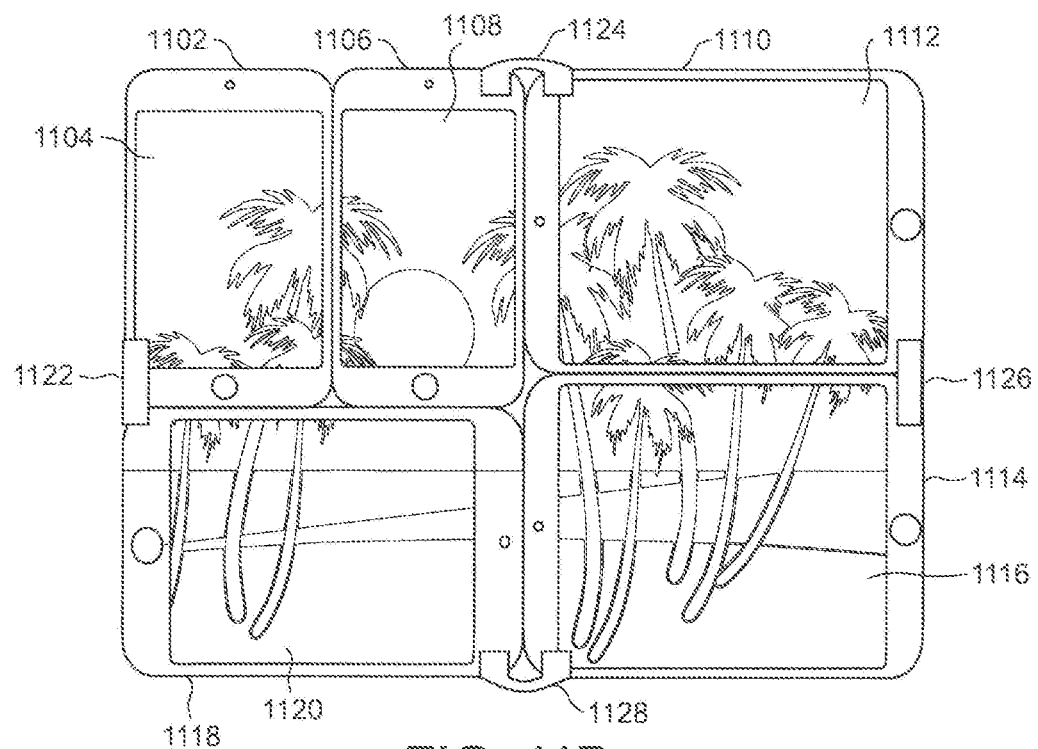
FIG. 11B shows still another illustrative apparatus in accordance with principles of the disclosure.

FIG. 11B shows the displays of OLED devices shown in FIG. 11A displaying a contiguous image.

Figure 12:
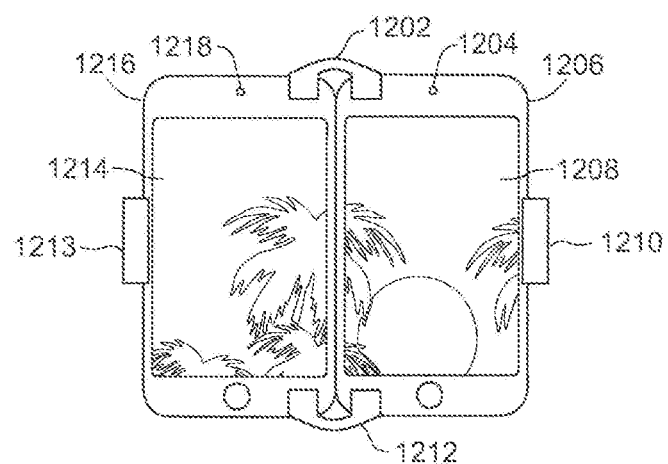
FIG. 12 shows yet another illustrative apparatus in accordance with principles of the disclosure.

FIG. 12 shows a device comprising bars (not shown) and clips 1202, 1210, 1212 and 1213. The device may hold OLED devices 1216 and 1206. Device 1216 may include OLED display 1214. Device 1206 may include OLED display 1208. Device 1216 may include camera 1218. Device 1206 may include camera 1204. Devices 1206 and 1216 may be configured to capture a stereoscopic photograph using cameras 1204 and 1218. Cameras 1204 and 1218 may be positioned to capture a viewing angle such as from a right eye and a left eye. The dual camera may be used in a synchronized fashion to capture stereoscopic and three-dimensional data.

In some embodiments, device 1206 may be positioned overlapping device 1216 (or vice versa) in order to capture the dual photographs using an appropriate viewing angle for three dimensional capturing.

Figure 13:
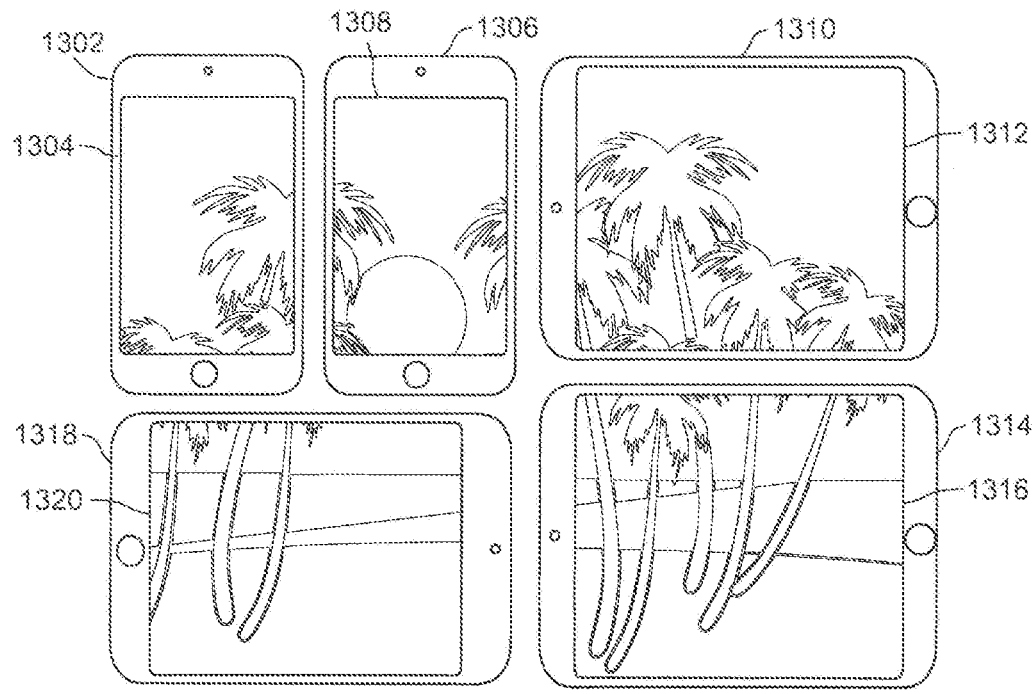
FIG. 13 shows still another illustrative apparatus in accordance with principles of the disclosure.

FIG. 13 shows a plurality of OLED devices (shown at 1302, 1306, 1310, 1314 and 1318). Each OLED device may include an OLED display (shown at 1304, 1308, 1312, 1316 and 1320). The devices may be shown in a predetermined proximity of one another, not connected with a clip or other device and not necessarily physically touching each other. The devices may be shown displaying a contiguous image.

Figure 14:
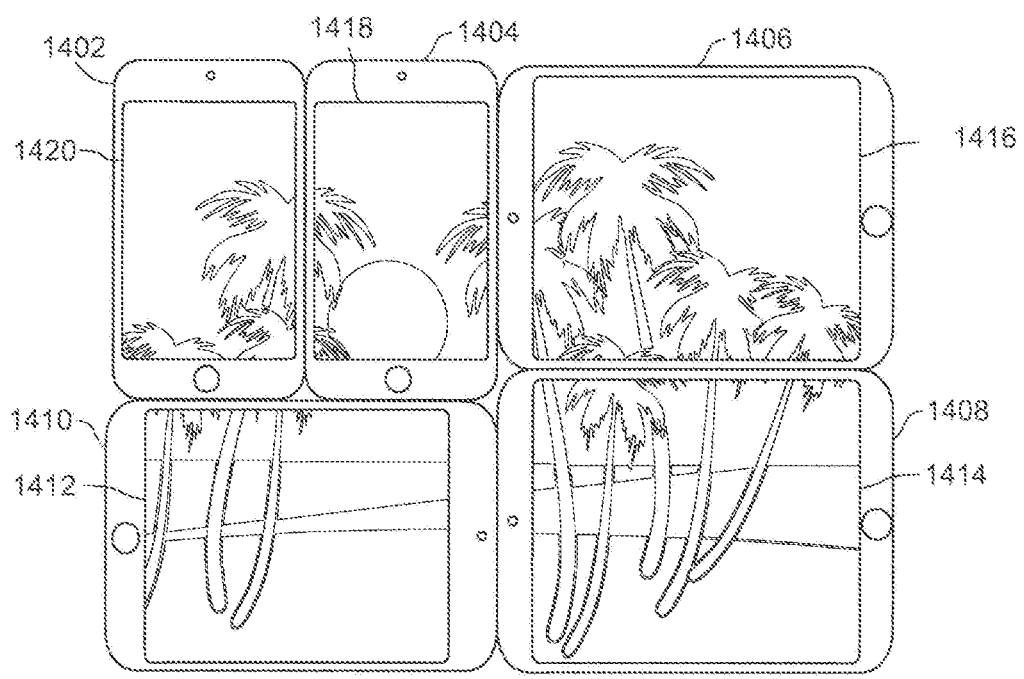
FIG. 14 shows yet another illustrative apparatus in accordance with principles of the disclosure.

FIG. 14 shows a plurality of OLED devices (shown at 1402, 1404, 1406, 1408 and 1410). Each of the OLED devices may include a display (shown at 1420, 1418, 1416, 1414 and 1412). In this embodiment, each of the OLED devices may be shown physically touching each other (independent of the assistance of a connection device). In this embodiments, the connection between the devices may be based on physical touching between the devices. In the event that one device is no longer physically touching a second OLED device, the device may no longer be used to display a contiguous image.

Figure 15:
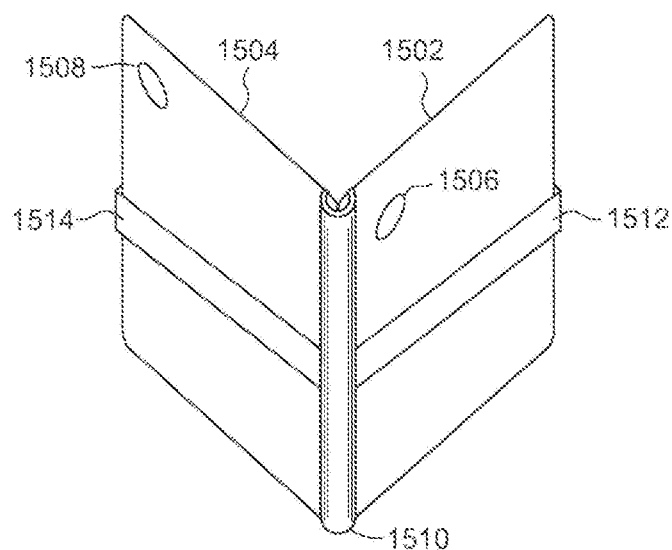
FIG. 15 shows still another illustrative apparatus in accordance with principles of the disclosure.

FIG. 15 shows device 1502 connected to device 1504 via a connection device. The connection device may include bars 1512 and 1514. The connection device may also include spine 1510. Spine 1510 may hold devices 1502 and 1504 in a specific configuration. Spine 1510 may be configured to be hinged in order to hold devices 1512 and 1514 at a variety of different angles. Cameras 1506 and 1508 may be used to capture photographs using devices 1512 and 1514.

Figure 16:
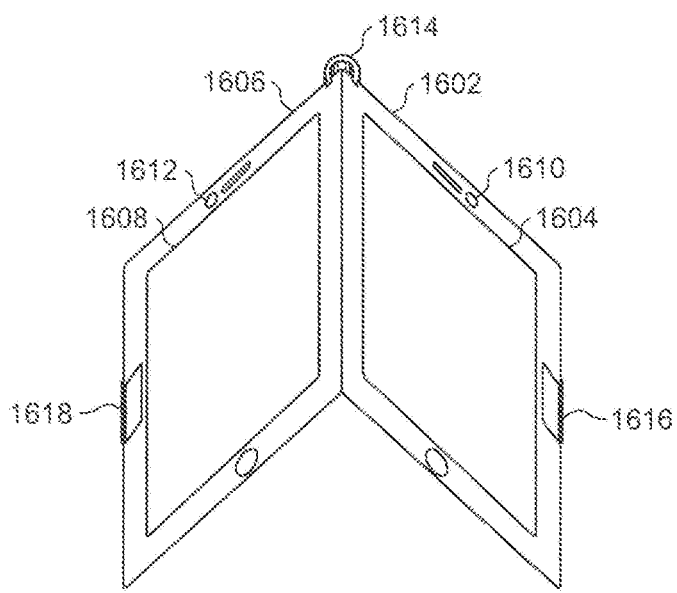
FIG. 16 shows yet another illustrative apparatus in accordance with principles of the disclosure.

FIG. 16 shows device 1606 and device 1610 connection via a connection device. The connection device may include spine 1614 and bars 1616 and 1618. Displays 1604 and 1608 may be used to view a contiguous image. Cameras 1610 and 1612 may be used to capture one or more panoramic, stereoscopic, three dimensional and/or typical video and/or photograph input.

Figure 17:
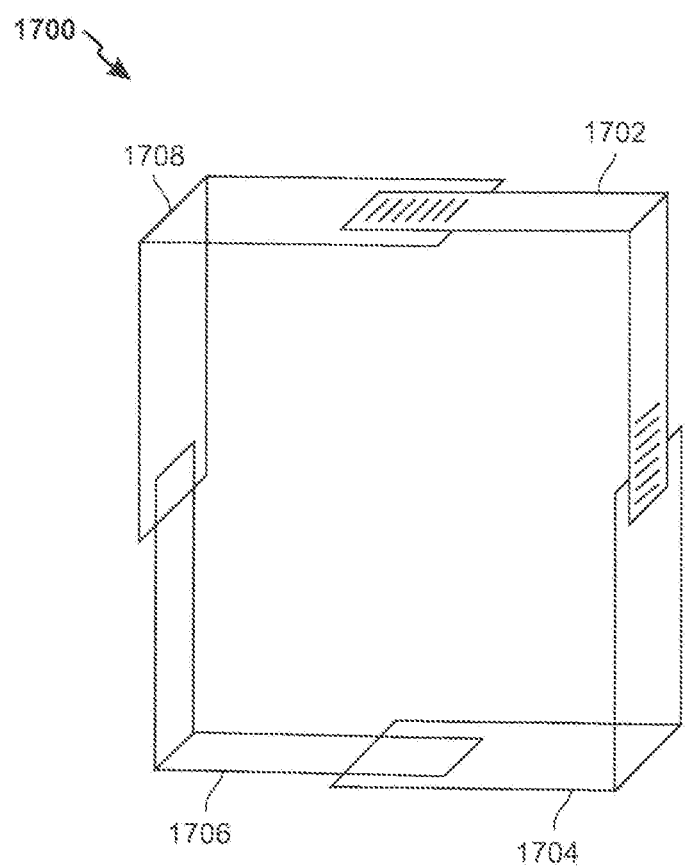
FIG. 17 shows yet still another illustrative apparatus in accordance with principles of the disclosure.

FIG. 17 shows connection device 1700. Connection device 1700 may be used to hold together one or more OLED devices. Connection device 1700 may include sections 1702, 1704, 1706 and 1708. Connection device 1700 may be expandable and/or retractable in order to hold OLED devices in one or more specific configurations. In some embodiments, connection device 1700 may be used in conjunction with connection device 1000, shown in FIG. 10A.

The steps of methods may be performed in an order other than the order shown and/or described herein. Embodiments may omit steps shown and/or described in connection with illustrative methods. Embodiments may include steps that are neither shown nor described in connection with illustrative methods.

Illustrative method steps may be combined. For example, an illustrative method may include steps shown in connection with another illustrative method.

Apparatus may omit features shown and/or described in connection with illustrative apparatus. Embodiments may include features that are neither shown nor described in connection with the illustrative apparatus. Features of illustrative apparatus may be combined. For example, an illustrative embodiment may include features shown in connection with another illustrative embodiment.

The drawings show illustrative features of apparatus and methods in accordance with the principles of the invention. The features are illustrated in the context of selected embodiments. It will be understood that features shown in connection with one of the embodiments may be practiced in accordance with the principles of the invention along with features shown in connection with another of the embodiments.

One of ordinary skill in the art will appreciate that the steps shown and described herein may be performed in other than the recited order and that one or more steps illustrated may be optional. The methods of the above-referenced embodiments may involve the use of any suitable elements, steps, computer-executable instructions, or computer-readable data structures. In this regard, other embodiments are disclosed herein as well that can be partially or wholly implemented on a computer-readable medium, for example, by storing computer-executable instructions or modules or by utilizing computer-readable data structures.

Thus, methods and apparatus for a device combining multiple, possibly different sized, OLED devices are provided. Persons skilled in the art will appreciate that the present invention can be practiced by other than the described embodiments, which are presented for purposes of illustration rather than of limitation, and that the present invention is limited only by the claims that follow.

What is claimed is:

1. A combination Organic Light Emitting Diode ("OLED") display comprising:
   a first device comprising a first OLED display;
   a second device comprising a second OLED display;
   wherein:
   the first OLED device communicates with the second OLED device;
   the first OLED display and the second OLED display are within a predetermined proximity of one another;
   the first OLED display and the second OLED display are configured to display a contiguous application; and
   wherein:
   the first device initiates direct communication with the second device;
   and the first device is a controlling device;
   the first device directly instructs the second device what to display on the second OLED display; and
   the first OLED display and the second OLED display each comprise:
   an array of organic light emitting diodes ("OLEDs") forming the respective OLED display, the array of OLEDs having a thickness that is not greater than 0.25 mm and having a surface area that is at least 90% of 85.60 mm×53.98 mm;
   a pressure sensitive button having a thickness that is not greater than 0.8 mm;

a wireless communication circuit having a thickness that is not greater than 0.8 mm;
a processor circuit comprising non-transitory memory and a processor, the processor circuit having a thickness that is not greater than 0.25 mm; and
a battery for powering the respective OLED display, the wireless communication circuit and the processor circuit, the battery having a thickness that is not greater than 0.5 mm;
wherein, in operation, the processor circuit is configured to control the respective OLED display and the wireless communication circuit by:
powering the wireless communication circuit using the battery for a first pre-determined time period in response to pressure applied to the pressure sensitive button;
during the first pre-determined time period:
instructing the wireless communication circuit to continuously scan for a wireless communication network;
in response to detecting the wireless communication network, formulating an encrypted request for an alert, the request associated with a destination and an identifier extracted from the non-transitory memory; and
using the wireless communication circuit, transmitting the encrypted request to the destination over the wireless communication network;
after the transmitting, powering the wireless communication circuit using the battery for a second predetermined time period;
during the second time period, receiving the alert from the destination over the wireless network, the alert comprising instructions formulated by the destination and executable by the processor circuit and
in response to receiving the alert, executing the instructions and thereby illuminating pixels within the respective OLED display as specified in the alert.

2. The combination OLED display of claim 1, wherein the first OLED display and the second OLED display are physically connected via a magnetic connection between a magnetic strip on the first OLED display and a magnetic strip on the second OLED display.

3. The combination OLED display of claim 1, wherein the first OLED device communicates with the second OLED device via a Bluetooth connection.

4. The combination OLED display of claim 1, wherein the first OLED device communicates with the second OLED device via a Beacon connection.

5. The combination OLED display of claim 1, wherein the first OLED device communicates with the second OLED device via a Universal Serial Bus ("USB") connection.

6. The combination OLED display of claim 1, wherein the first OLED device communicates with the second OLED device via a wired connection.

7. The combination OLED display of claim 1, wherein, when the second OLED device initiates the communication with the first OLED device, the combination OLED display displays an application displayed on the second OLED display in a larger size than an initial display of the application displayed on the second OLED display.

8. The combination OLED display of claim 1, further comprising:
a third OLED device comprising a third OLED display;
wherein:
the third OLED device communicates with the second OLED device and/or the third OLED device;
the first OLED display, the second OLED display and the third OLED display are within a predetermined proximity of one another; and
the first OLED display, the second OLED display and the third OLED display are configured to display a contiguous application.

9. The combination OLED display of claim 8, wherein:
the first OLED device communicates directly with the second OLED device and the second OLED device communicates directly with the third OLED device, the communication between the first OLED device and the second OLED device, and the second OLED device and the third OLED device include information relating to an entire display of the contiguous application; and
each of the first OLED device, the second OLED device and the third OLED device determines a portion of the entire image and displays the determined portion on the first OLED display, the second OLED display and the third OLED display, respectively.

10. The combination OLED display of claim 8, wherein the first OLED device communicates with:
the second OLED device; and
the third OLED device;
wherein the communication between the first OLED device and the second OLED device and the communication between the first OLED device and the third OLED device comprises:
instructions to each device including an image to display, an orientation of the image, and a size to display the image.

11. A combination Organic Light Emitting Diode ("OLED") display comprising:
a first mobile device comprising a first OLED display;
a second mobile device comprising a second OLED display; and
a third mobile device comprising a third OLED display;
wherein:
the first device is a controlling device and initiates direct communication with the second OLED device, the communication comprising data relating to an entire image of a contiguous application to be displayed on the combination of the first display, second display and third display;
the second device communicates directly with the third device, the communication comprising data relating to the entire image to be displayed;
the first OLED display, the second OLED display and the third OLED display are within a predetermined proximity of one another;
each of the first OLED device, the second OLED device and the third OLED device determines a portion of the entire image and displays the determined portion on the first OLED display, the second OLED display and the third OLED display, respectively; and
the first OLED display, the second OLED display and the third OLED display each comprise:
an array of organic light emitting diodes ("OLEDs") forming the respective OLED display, the array of OLEDs having a thickness that is not greater than 0.25 mm and having a surface area that is at least 90% of 85.60 mm×53.98 mm;
a pressure sensitive button having a thickness that is not greater than 0.8 mm;

a wireless communication circuit having a thickness that is not greater than 0.8 mm;

a processor circuit comprising non-transitory memory and a processor, the processor circuit having a thickness that is not greater than 0.25 mm; and a battery for powering the respective OLED display, the wireless communication circuit and the processor circuit, the battery having a thickness that is not greater than 0.5 mm;

wherein, in operation, the processor circuit is configured to control the respective OLED display and the wireless communication circuit by:

powering the wireless communication circuit using the battery for a first pre-determined time period in response to pressure applied to the pressure sensitive button;

during the first pre-determined time period:

instructing the wireless communication circuit to continuously scan for a wireless communication network;

in response to detecting the wireless communication network, formulating an encrypted request for an alert, the request associated with a destination and an identifier extracted from the non-transitory memory; and using the wireless communication circuit, transmitting the encrypted request to the destination over the wireless communication network;

after the transmitting, powering the wireless communication circuit using the battery for a second predetermined time period;

during the second time period, receiving the alert from the destination over the wireless network, the alert comprising instructions formulated by the destination and executable by the processor circuit and in response to receiving the alert, executing the instructions and thereby illuminating pixels within the respective OLED display as specified in the alert.

12. The combination OLED display of claim 11, wherein the predetermined proximity is within 0-12 inches.

13. The combination OLED display of claim 11, wherein the predetermined proximity is within 0-2 inches.

* * * * *